(12) United States Patent
Gill et al.

(10) Patent No.: US 7,646,570 B2
(45) Date of Patent: Jan. 12, 2010

(54) CPP READ SENSOR HAVING CONSTRAINED CURRENT PATHS MADE OF LITHOGRAPHICALLY-DEFINED CONDUCTIVE VIAS WITH SURROUNDING OXIDIZED METAL SUBLAYERS AND METHOD OF MAKING SAME

(75) Inventors: Hardayal Singh Gill, Palo Alto, CA (US); Jordan Asher Katine, Mountain View, CA (US); Alexander Zeltser, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 653 days.

(21) Appl. No.: 11/496,604

(22) Filed: Jul. 31, 2006

(65) Prior Publication Data

US 2008/0024937 A1    Jan. 31, 2008

(51) Int. Cl.
*G11B 5/39*      (2006.01)
*H04R 31/00*     (2006.01)
(52) U.S. Cl. ............... 360/324.2; 29/603.15; 29/603.18
(58) Field of Classification Search ... 360/324.1–324.2; 428/810–816; 257/421–427; 365/145, 158, 365/171–173
See application file for complete search history.

(56) References Cited

U.S. PATENT DOCUMENTS

| | | | |
|---|---|---|---|
| 7,420,786 B2* | 9/2008 | Sugiyama et al. | 360/322 |
| 2002/0048128 A1* | 4/2002 | Kamiguchi et al. | 360/324.1 |
| 2003/0231436 A1* | 12/2003 | Nishiyama | 360/324.1 |
| 2004/0042127 A1* | 3/2004 | Hoshiya et al. | 360/322 |
| 2004/0114280 A1 | 6/2004 | Yoshikawa et al. | |
| 2004/0246631 A1* | 12/2004 | Dieny et al. | 360/324.1 |
| 2005/0122633 A1 | 6/2005 | Nowak et al. | |

* cited by examiner

*Primary Examiner*—A. J. Heinz
(74) *Attorney, Agent, or Firm*—John J. Oskorep, Esq.; Rambod Nader

(57) ABSTRACT

Current-perpendicular-to-plane (CPP) read sensors having constrained current paths made of lithographically-defined conductive vias with surrounding oxidized metal sublayers, and methods of making the same, are disclosed. In one illustrative example, at least part of a sensor stack structure which includes an electrically conductive spacer layer is formed. A metal (e.g. Ta) sublayer is then deposited over and adjacent the spacer layer, followed by one of an oxidation process, a nitridation process, and an oxynitridation process, to produce an insulator (e.g. TaOx) from the metal sublayer. The metal sublayer deposition and oxidation/nitridation/oxynitridation processes are repeated as necessary to form the insulator with a suitable thickness. Next, a resist structure which exposes one or more portions of the insulator is formed over the insulator. With the resist structure in place, exposed insulator materials are removed by etching to form one or more apertures through the insulator down to the spacer layer. Electrically conductive materials are subsequently deposited within the one or more apertures to form one or more lithographically-defined conductive vias of a current-constraining structure. Advantageously, the lithographically-defined conductive vias increase the current density of the read sensor in the region of the sensing layers to thereby simultaneously increase its resistance and magnetoresistance. With use of the process of oxidation, nitridation, or oxynitridation on each metal sublayer, degradation of the spacer layer is reduced or eliminated such that the desirable soft magnetics of the sensing layers in the read sensor are maintained.

20 Claims, 17 Drawing Sheets

CPP READ SENSOR HAVING CONSTRAINED CURRENT PATHS MADE OF LITHOGRAPHICALLY-DEFINED CONDUCTIVE VIAS WITH SURROUNDING OXIDIZED METAL SUBLAYERS AND METHOD OF MAKING SAME

BACKGROUND

1. Field of the Technology

The present disclosure relates generally to read sensors of magnetic heads in data storage devices, and more particularly to read sensors of the current-perpendicular-to-plane (CPP) type having constrained current paths made of lithographically-defined conductive vias with surrounding oxidized metal layers.

2. Description of the Related Art

Today's computer devices often include auxiliary memory storage devices having media on which data can be written and from which data can be read for later use. A direct access storage device (disk drive) incorporating rotating magnetic disks are commonly used for storing data in magnetic form on the disk surfaces. Data is recorded on concentric, radially spaced tracks on the disk surfaces. Magnetic heads which include read sensors are then used to read data from the tracks on the disk surfaces.

Magnetoresistive (MR) read sensors, commonly referred to as MR heads, are used in high capacity disk drives and may read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage. Within the general category of MR sensors is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers. GMR sensors using only two layers of ferromagnetic material (e.g. nickel-iron, cobalt-iron, or nickel-iron-cobalt) separated by a layer of nonmagnetic material (e.g. copper) are generally referred to as spin valve (SV) sensors manifesting the SV effect.

One of the ferromagnetic (FM) layers referred to as the pinned layer has its magnetization typically pinned by exchange coupling with an antiferromagnetic (AFM) layer (e.g., nickel-oxide, iron-manganese, or platinum-manganese). The pinning field generated by the AFM pinning layer should be greater than demagnetizing fields to ensure that the magnetization direction of the pinned layer remains fixed during application of external fields (e.g. fields from bits recorded on the disk). The magnetization of the other FM layer referred to as the free layer, however, is not fixed and is free to rotate in response to the field from the information recorded on the magnetic medium (the signal field). The pinned layer may be part of an antiparallel (AP) pinned structure which includes an antiparallel coupling (APC) layer formed between first and second AP pinned layers. The first AP pinned layer, for example, may be the layer that is exchange coupled to and pinned by the AFM pinning layer. By strong antiparallel coupling between the first and second AP pinned layers, the magnetic moment of the second AP pinned layer is made antiparallel to the magnetic moment of the first AP pinned layer.

Sensors are classified as a bottom sensor or a top sensor depending upon whether the pinned layer is located near the bottom of the sensor close to the first read gap layer or near the top of the sensor close to the second read gap layer. Sensors are further classified as simple pinned or AP pinned depending upon whether the pinned structure is one or more FM layers with a unidirectional magnetic moment or a pair of AP pinned layers separated by the APC layer with magnetic moments of the AP pinned layers being antiparallel. Sensors are still further classified as single or dual wherein a single sensor employs only one pinned layer and a dual sensor employs two pinned layers with the free layer structure located there between.

A read sensor may also be of a current-perpendicular-to-plane (CPP) type in which current flows perpendicular to the major planes of the sensor layers. First and second shield layers engage the bottom and the top, respectively, of the sensor so as to simultaneously serve as electrically conductive leads for the sensor. The CPP sensor may be contrasted with a current-in-plane (CIP) type sensor in which the current is conducted in planes parallel to the major thin film planes of the sensor. In a CPP sensor, when the spacer layer between the free layer and the AP pinned structure is nonmagnetic and electrically conductive (such as copper), the current is referred to as a "sense current"; however when the spacer layer is nonmagnetic and electrically nonconductive (such as aluminum oxide), the current is referred to as a "tunneling current". Hereinafter, the current is referred to as a perpendicular current $I_p$ which can be either a sense current or a tunneling current.

All conventional metallic CPP read sensors have several shortcomings. First, their resistance-area (RA) products are quite low. For typical sensor areas, this results in read sensors having low resistance values which are poorly matched to amplifiers of the read circuitry. In addition, parasitic resistances from layers of the read sensor that do not contribute to the magnetoresistance (e.g. the AFM layers) lower the signal-to-noise ratio (SNR) of the sensor. Finally, unlike magnetic tunneling junction (MTJ) CPP sensors using the current $I_p$ as a tunneling current, the relatively low resistance of all metallic CPP sensors requires them to operate at very high current densities. However, effects such as the spin torque phenomenon and the Oersted field from the perpendicular current $I_p$ limit current densities suitable for stable sensor operation.

Current densities of CPP read sensors may be increased by restricting the flow of the perpendicular current $I_p$ through the sensor stack. Conventionally, this may be achieved by utilizing "current-screen" layers which are created by placing one or more ultra-thin insulating layers (a nano-oxide layer or NOL) within the sensor. Many tiny randomly-distributed conductive pores or holes, which restrict the current flow and concentrate the current density near the active layers of the sensor, are created through this process. In practice, however, the process is difficult to control and does not achieve adequate and manufacturable results. As sensors become smaller, the sensor covers such a small region of the film that statistical variations in the distribution of conductive pores, and therefore in the current density may cause uncontrollable and unacceptable variations in the sensor resistance.

Accordingly, there is an existing need to overcome these and other deficiencies of the prior art.

SUMMARY

Current-perpendicular-to-plane (CPP) read sensors having constrained current paths made of lithographically-defined conductive vias with surrounding oxidized metal sublayers, and methods of making the same, are disclosed. In one illustrative example, at least part of a sensor stack structure which includes an electrically conductive spacer layer is formed. A metal sublayer is then deposited over and adjacent the spacer layer, followed by one of an oxidation process, a nitridation process, and an oxynitridation process, to produce an insulator (e.g. an oxidized metal) from the metal sublayer. The metal sublayer deposition and oxidation/nitridation/oxynitridation processes are repeated as necessary to form the insulator with a suitable thickness. Next, a resist structure which exposes one or more portions of the insulator is formed over the insulator. With the resist structure in place, exposed insulator materials are removed by etching to form one or more apertures through the insulator down to the spacer layer. Electrically conductive materials are subsequently deposited within the one or more apertures to form one or more lithographically-defined conductive vias of a current-constraining structure.

Advantageously, the lithographically-defined conductive vias increase the current density of the read sensor in the region of the sensing layers to thereby simultaneously increase its resistance and magnetoresistance. With use of the process of oxidation, nitridation, or oxynitridation on each metal sublayer, degradation of the spacer layer is reduced or eliminated such that the desirable soft magnetics of the free layer in the read sensor are maintained.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION OF THE PREFERRED EMBODIMENTS

Current-perpendicular-to-plane (CPP) read sensors having constrained current paths made of lithographically-defined conductive vias with surrounding oxidized metal sublayers, and methods of making the same, are disclosed. In one illustrative example, at least part of a sensor stack structure which includes an electrically conductive spacer layer is formed. A metal sublayer is deposited over and adjacent the spacer layer, followed by one of an oxidation process, a nitridation process, and an oxynitridation process, to produce an insulator (e.g. an oxidized metal) from the metal sublayer. The metal sublayer deposition and oxidation/nitridation/oxynitridation processes are repeated as necessary to form the insulator with a suitable thickness. Next, a resist structure which exposes one or more portions of the insulator is formed over the insulator. With the resist structure in place, exposed insulator materials are removed by etching to form one or more apertures through the insulator down to the spacer layer. Electrically conductive materials are subsequently deposited within the one or more apertures to form one or more lithographically-defined conductive vias of a current-constraining structure. Advantageously, the lithographically-defined conductive vias increase the current density of the read sensor in the region of the sensing layers to thereby simultaneously increase its resistance and magnetoresistance. The size and number of vias may be varied and selected so as to precisely "tune" the sensor's resistance and magnetoresistance. As there is increasing evidence that the magnetoresistive effect is reduced near edges of the read sensor from milling damage, it is also advantageous to isolate a single or few vias in the center of the sensor structure to avoid such damage. With use of the process of oxidation, nitridation, or oxynitridation on each metal sublayer, degradation of the spacer layer is reduced or eliminated such that the desirable soft magnetics of the free layer in the read sensor are maintained.

The following description is the best embodiment presently contemplated for carrying out the present invention. This description is made for the purpose of illustrating the general principles of the present invention and is not meant to limit the inventive concepts claimed herein.

Figure 1:
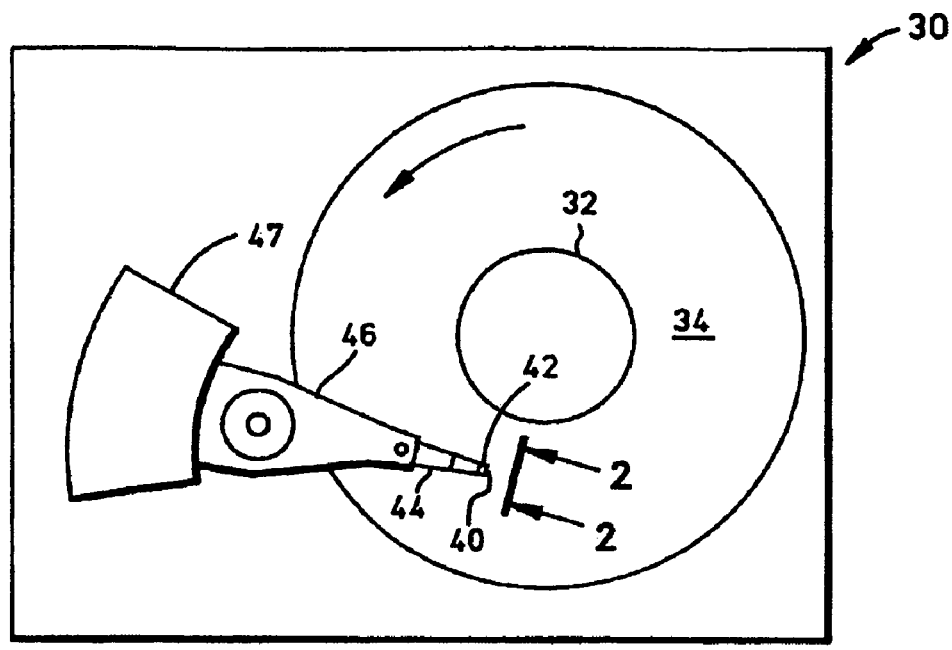
FIG. 1 is a plan view of an exemplary prior art magnetic disk drive.
Figure 2:
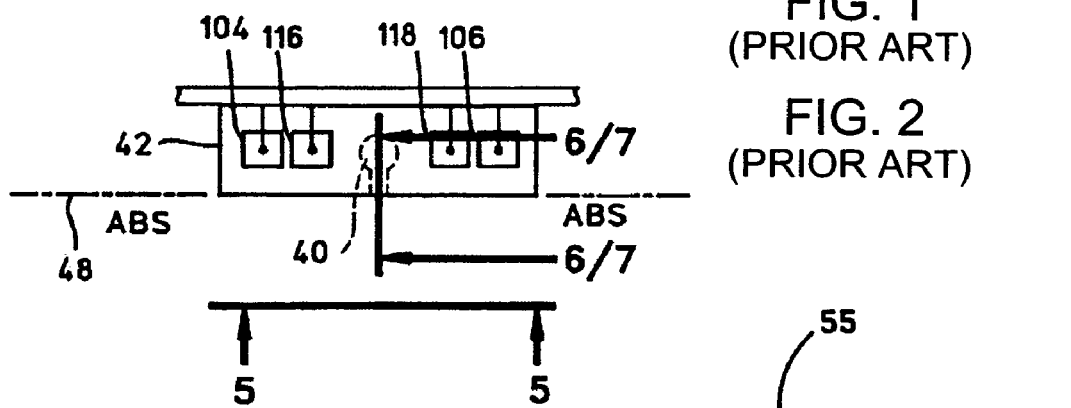
FIG. 2 is an end view of a slider with a magnetic head of the disk drive as seen in plane 2-2 of FIG. 1.
Figure 3:
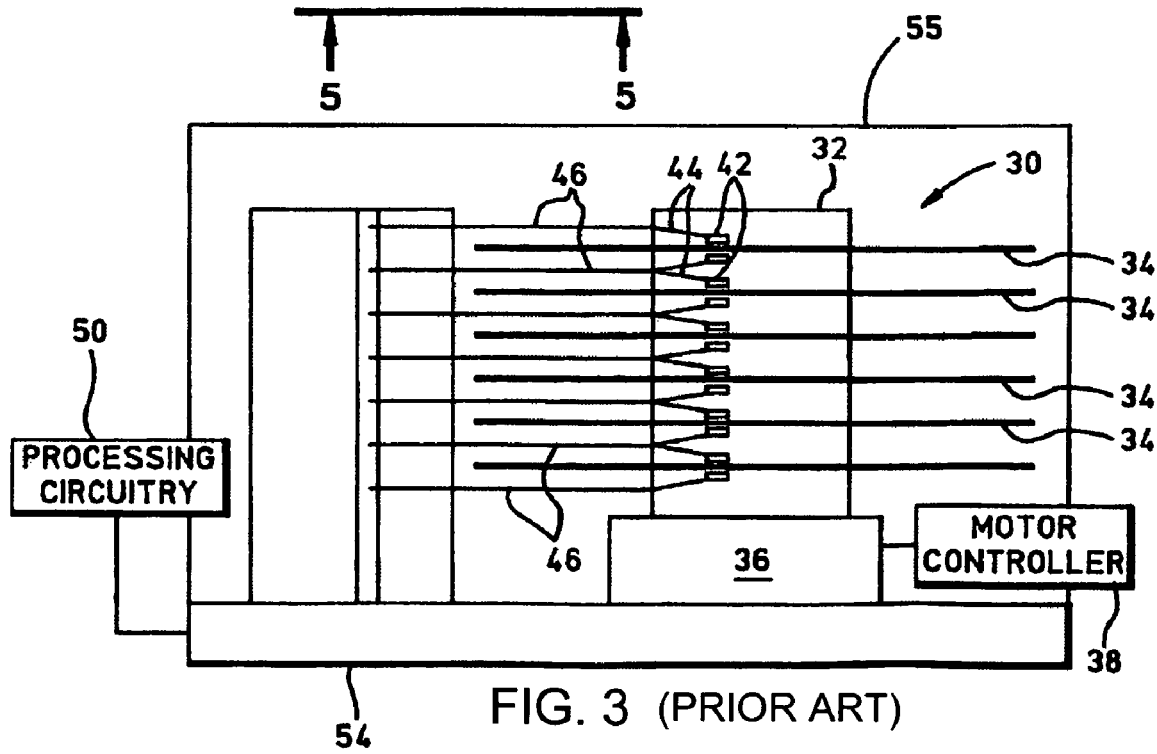
FIG. 3 is an elevation view of the magnetic disk drive wherein multiple disks and magnetic heads are employed.
Figure 4:
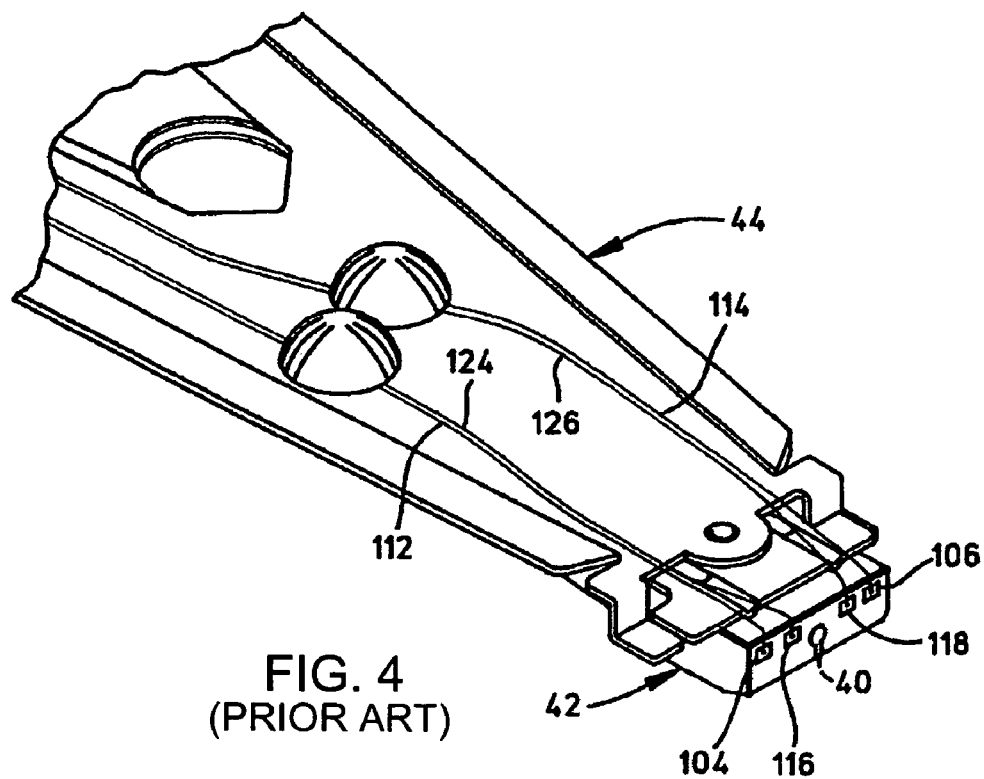
FIG. 4 is an isometric illustration of an exemplary prior art suspension system for supporting the slider and magnetic head.
Figure 5:
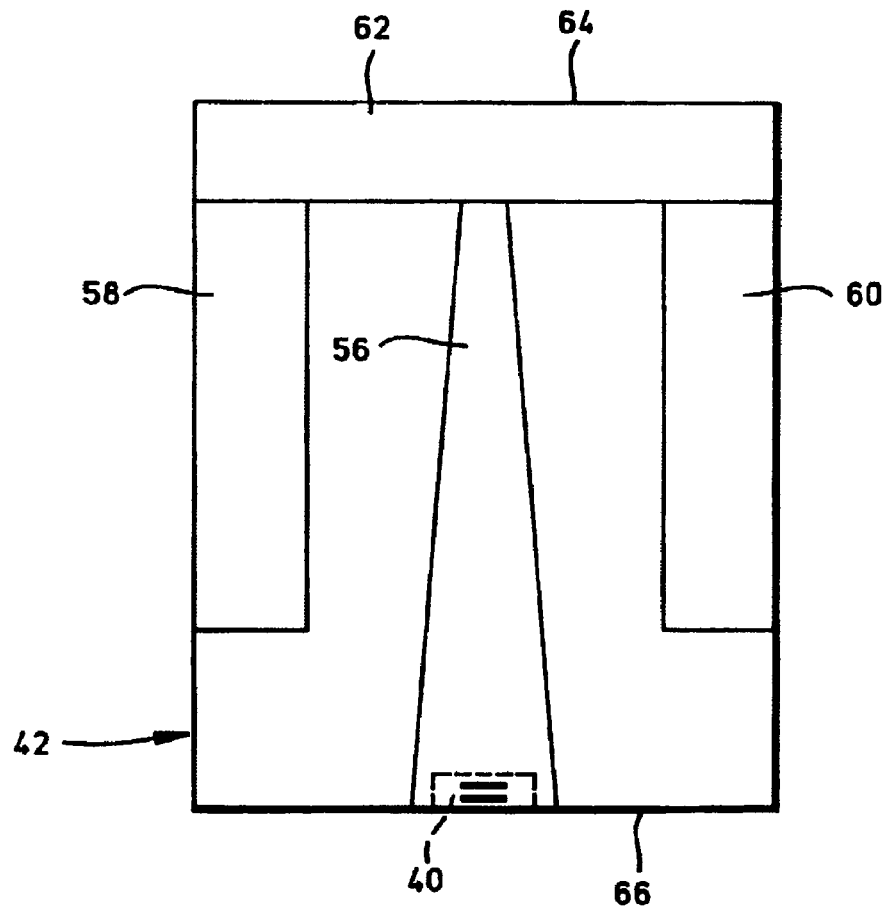
FIG. 5 is an ABS view of the magnetic head taken along plane 5-5 of FIG. 2.

General Disk Drive and Magnetic Head Architecture. Referring now to the drawings wherein like reference numerals designate like or similar parts throughout the several views, FIGS. 1-3 illustrate a magnetic disk drive 30. Disk drive 30 includes a spindle 32 that supports and rotates a magnetic disk 34. Spindle 32 is rotated by a spindle motor 36 that is controlled by a motor controller 38. A slider 42 includes a combined read and write magnetic head 40 and is supported by a suspension 44 and actuator arm 46 that is rotatably positioned by an actuator 47. Magnetic head 40 may utilize the read sensor which is made in accordance with the present invention. A plurality of disks, sliders, and suspensions may be employed in a large capacity direct access storage device (DASD) as shown in FIG. 3. Suspension 44 and actuator arm 46 are moved by actuator 47 to position slider 42 so that magnetic head 40 is in a transducing relationship with a surface of magnetic disk 34. When disk 34 is rotated by spindle motor 36, slider 42 is supported on a thin (typically, 0.05 µm) cushion of air (air bearing) between the surface of disk 34 and an air bearing surface (ABS) 48. Magnetic head 40 may then be employed for writing information to multiple circular tracks on the surface of disk 34, as well as for reading information therefrom. Processing circuitry 50 exchanges signals, representing such information, with head 40, provides spindle motor drive signals for rotating magnetic disk 34, and provides control signals to actuator 47 for moving slider 42 to various tracks. In FIG. 4, slider 42 is shown mounted to a suspension 44. The components described hereinabove may be mounted on a frame 54 of a housing 55, as shown in FIG. 3. FIG. 5 is an ABS view of slider 42 and magnetic head 40. Slider 42 has a center rail 56 that supports magnetic head 40, and side rails 58 and 60. Rails 56, 58 and 60 extend from a cross rail 62. With respect to rotation of magnetic disk 34, cross rail 62 is at a leading edge 64 of slider 42 and magnetic head 40 is at a trailing edge 66 of slider 42.

Figure 6:
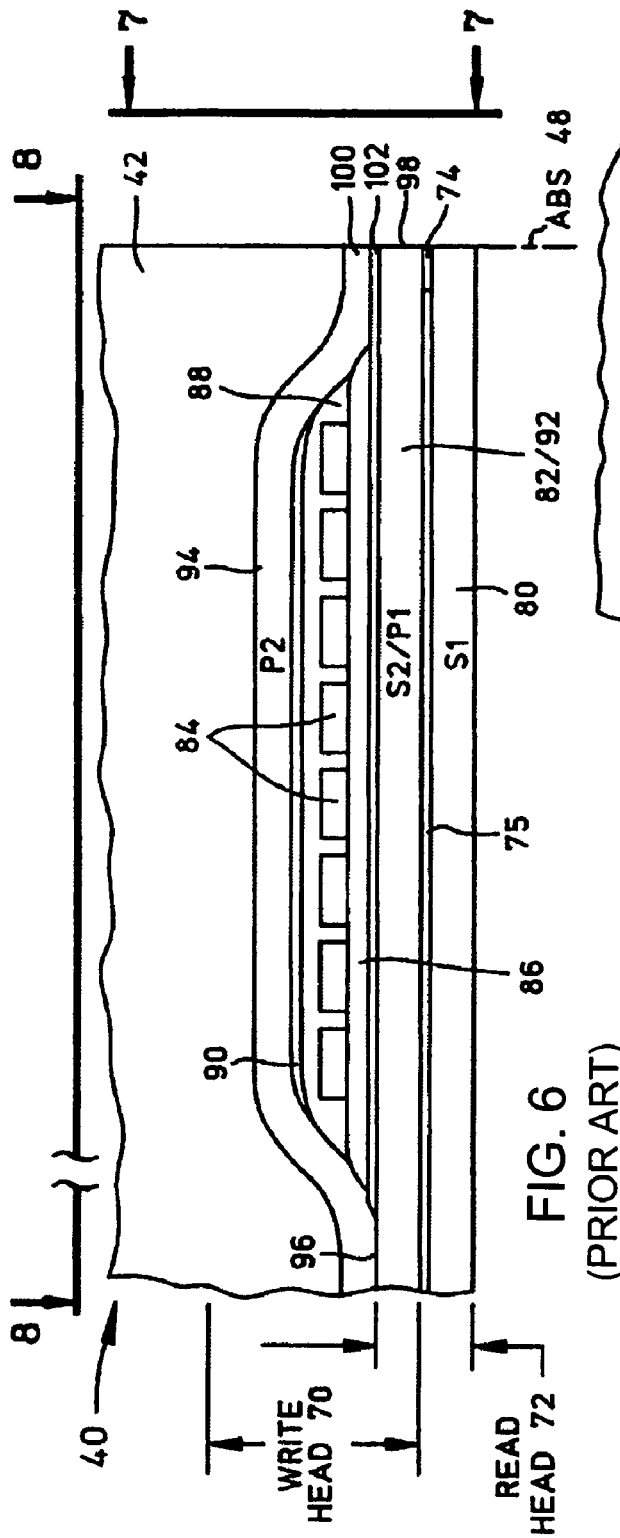
FIG. 6 is a partial view of the slider and a merged magnetic head as seen in plane 6-6 of FIG. 2.
Figure 7:
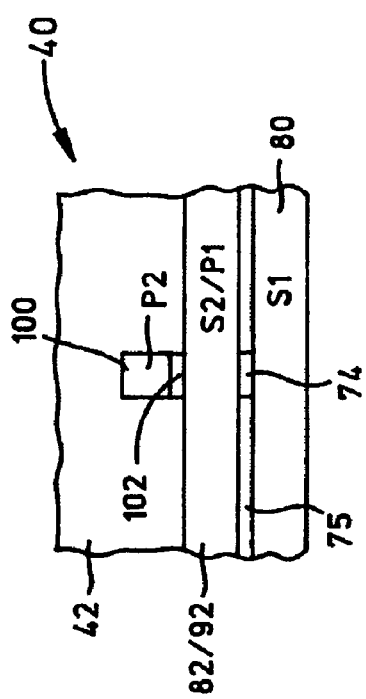
FIG. 7 is a partial ABS view of the slider taken along plane 7-7 of FIG. 6 to show the read and write elements of the magnetic head.

FIG. 6 is a side cross-sectional elevation view of a merged magnetic head 40, which includes a write head portion 70 and a read head portion 72. Read head portion 72 includes a CPP giant magnetoresistive (GMR) read head which utilizes a CPP sensor 74. FIG. 7 is an ABS view of FIG. 6. CPP sensor 74 is sandwiched between ferromagnetic first and second shield layers 80 and 82. In response to external magnetic fields, the resistance of CPP sensor 74 changes. A sense current $I_s$ conducted through the sensor causes these resistance changes to be manifested as potential changes. These potential changes are then processed as readback signals by processing circuitry 50 shown in FIG. 3.

Figure 8:
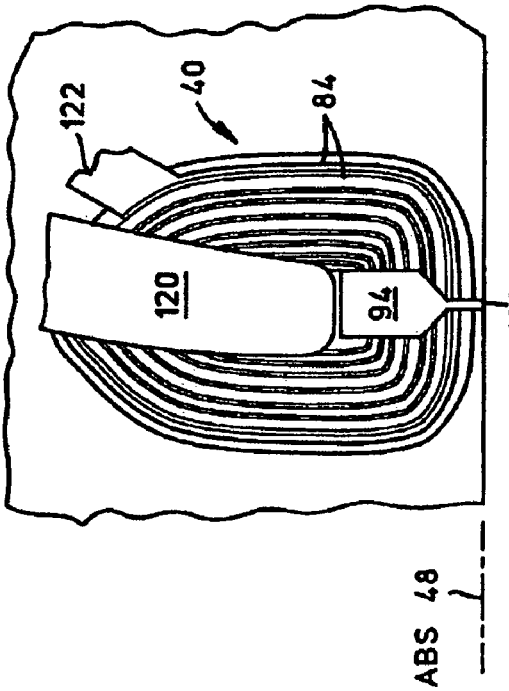
FIG. 8 is a view taken along plane 8-8 of FIG. 6 with all material above the coil layer and leads removed.

Write head portion 70 of magnetic head 40 includes a coil layer 84 sandwiched between first and second insulation layers 86 and 88. A third insulation layer 90 may be employed for planarizing the head to eliminate ripples in the second insulation layer caused by coil layer 84. The first, second and third insulation layers are referred to in the art as an "insulation stack". Coil layer 84 and first, second and third insulation layers 86, 88 and 90 are sandwiched between first and second pole piece layers 92 and 94. First and second pole piece layers 92 and 94 are magnetically coupled at a back gap 96 and have first and second pole tips 98 and 100 which are separated by a write gap layer 102 at the ABS. Since second shield layer 82 and first pole piece layer 92 are a common layer, this head is known as a merged head. In a piggyback head an insulation layer is located between a second shield layer and a first pole piece layer. As shown in FIGS. 2 and 4, first and second solder connections 104 and 106 connect leads from spin valve sensor 74 to leads 112 and 114 on suspension 44, and third and fourth solder connections 116 and 118 connect leads 120 and 122 from the coil 84 (see FIG. 8) to leads 124 and 126 on suspension 44.

Figure 9:
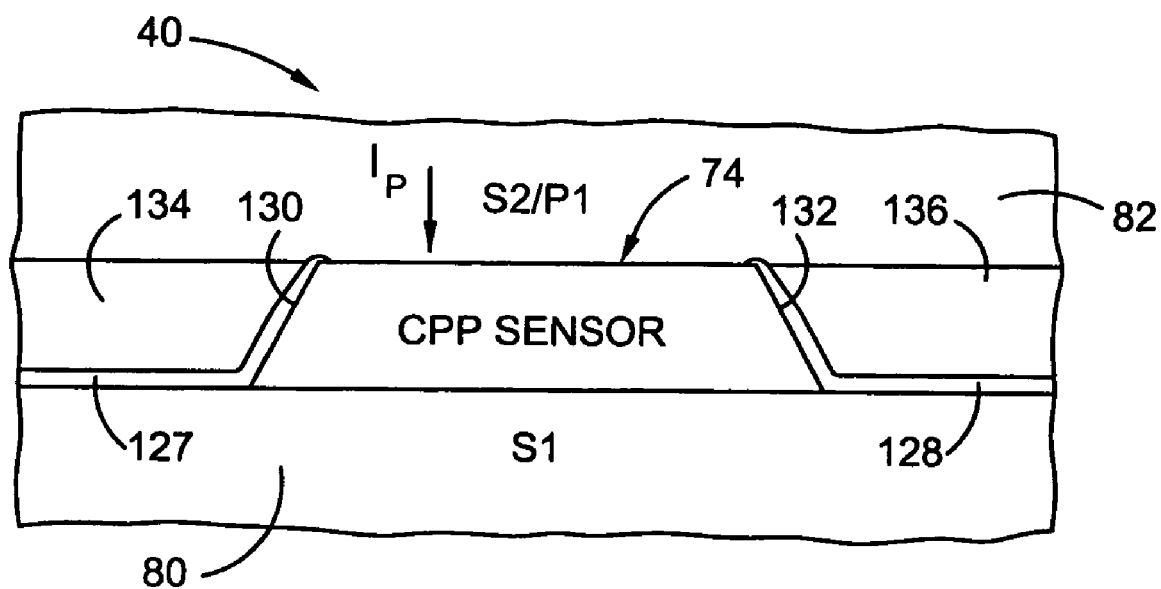
FIG. 9 is an enlarged isometric ABS illustration of a magnetic head having a current-perpendicular-to-plane (CPP) type sensor.

FIG. 9 is an enlarged ABS illustration of the prior art read head portion shown in FIG. 7. The read head includes the CPP sensor 74. First and second insulation layers 127 and 128, such as alumina, cover the first shield layer 80 on each side of the sensor 74 as well as slightly covering first and second sidewalls 130 and 132 of the sensor. First and second hard bias layers (HB) 134 and 136 are on the insulation layers 127 and 128 and are adjacent the side walls 130 and 132. Metallic seed layers (not shown in FIG. 9) are formed between insulator layers 127 and 128 and hard bias layers 134 and 136. The hard bias layers 134 and 136 cause magnetic fields to extend longitudinally through the sensor 74 for stabilizing the free layer. The sensor 74 and the first and second hard bias layers 134 and 136 are located between ferromagnetic first and second shield layers 80 and 82 which may serve as leads for conducting the perpendicular current $I_p$ through the sensor 74.

Figure 10:
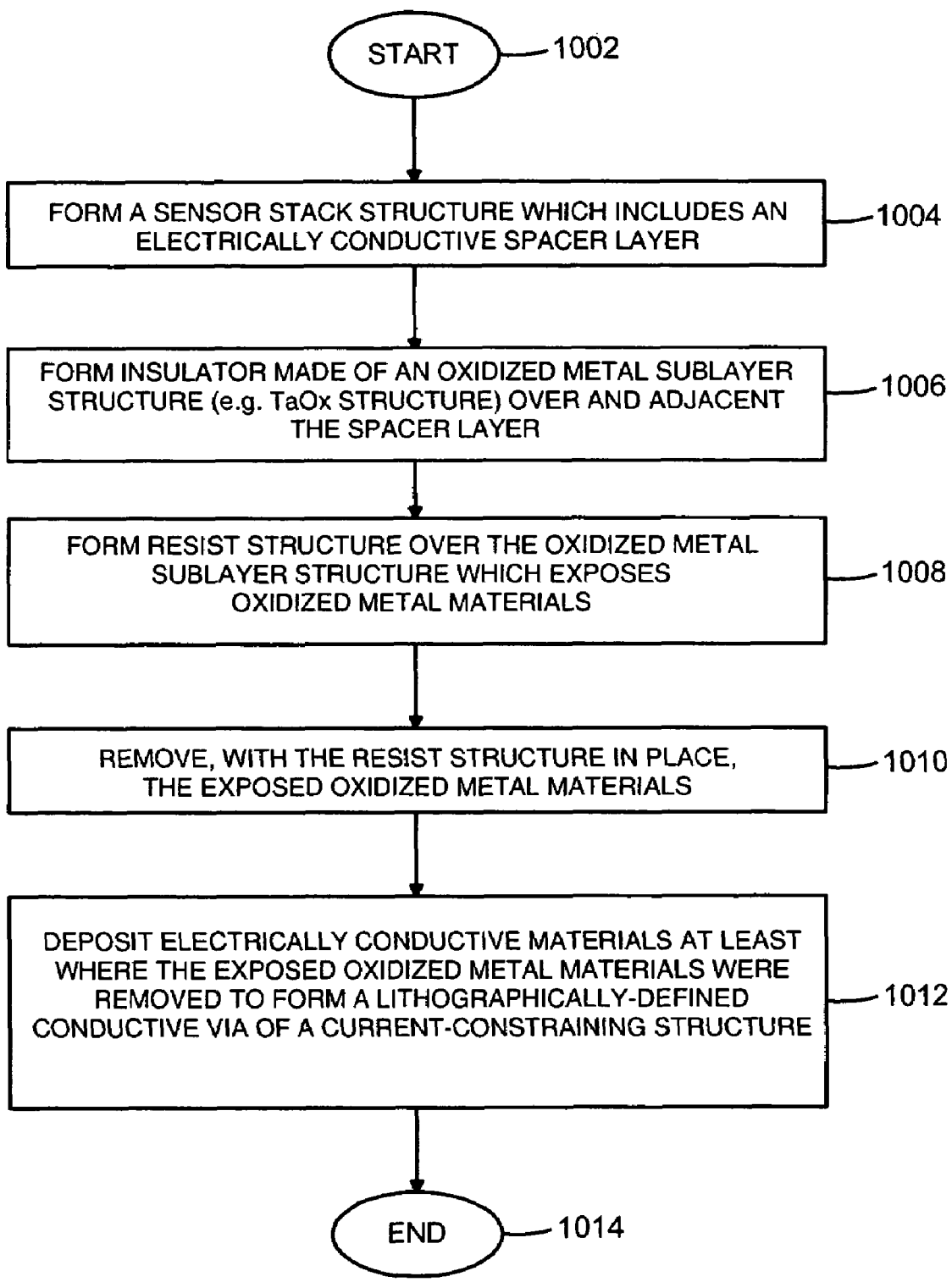
FIG. 10 is a flowchart which describes a fabrication process for a CPP sensor having constrained current paths made of lithographically-defined conductive vias.

General Process for Current-Constraining Structure Formation of FIGS. 10-16. FIG. 10 is a flowchart which describes a fabrication process for an exemplary CPP read sensor having a current-constraining structure made of one or more lithographically-defined conductive vias. FIGS. 11-16, which are a series of ABS illustrations showing partially-fabricated sensor structures corresponding to the steps described in the flowchart of FIG. 10, will be referred to in combination with the flowchart steps of FIG. 10.

Figure 11:
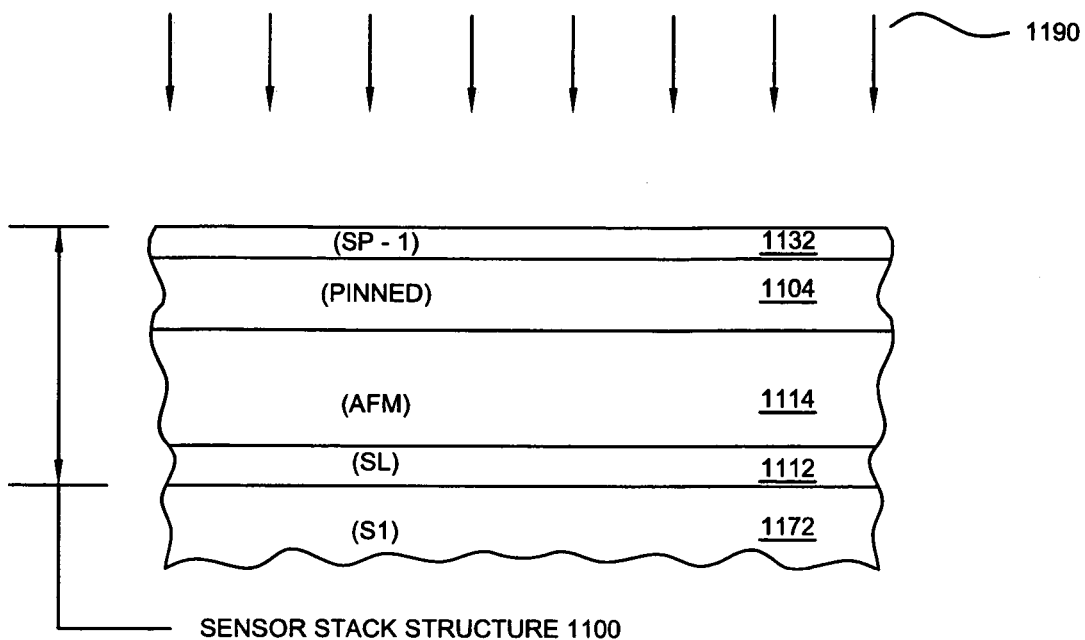
FIG. 11 is the first in a series of ABS illustrations of FIGS. 11-15 of partially fabricated sensor structures corresponding to the steps described in the flowchart of FIG. 10, showing that a read sensor stack structure which includes an electrically conductive spacer layer is formed over a first shield layer.

Beginning at a start block 1002 of FIG. 10 in combination with FIG. 11, at least a portion of a CPP sensor stack structure 1100 having an electrically conductive spacer layer portion (SP-1) 1132 is formed over a first shield layer (S1) 1172 (step 1004 of FIG. 10). CPP sensor stack structure 1100 may be made of any suitable sensor materials and, in this embodiment, includes (from bottom to top) a seed layer (SL) 1112, an antiferromagnetic (AFM) pinning layer 1114, a pinned layer structure 1104, and spacer layer portion (SP-1) 1132. In this "bottom-SV" exemplary configuration, pinned layer structure 1104 is formed beneath and adjacent spacer layer portion 1132 and over and adjacent AFM pinning layer 1114. AFM pinning layer 1114 is formed beneath and adjacent pinned layer structure 1104 and over and adjacent to seed layer 1112. Seed layer 1112 is formed over and adjacent first shield layer 1172 and underneath AFM pinning layer 1114 for promoting an improved texture of the layers deposited thereon. In this embodiment, spacer layer portion 1132 will form only a bottom portion or bottom sublayer (SP-1) of the entire spacer layer structure of the resulting CPP read sensor. Spacer layer portion 1132 is highly-conductive and non-magnetic, and may be made of suitable materials such as copper (Cu) or gold (Au).

Figure 12:
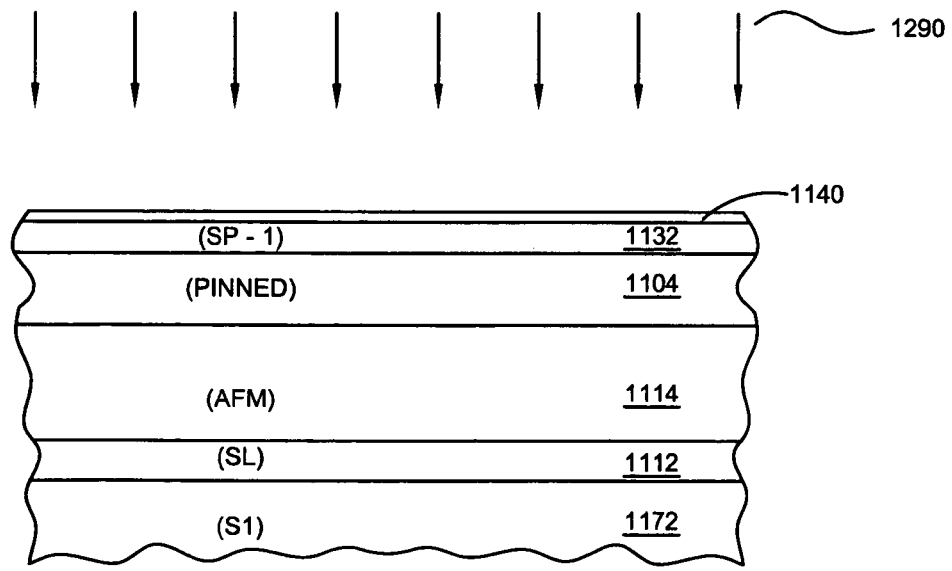
FIG. 12 is the second in a series of ABS illustrations of FIGS. 11-15 of partially fabricated sensor structures corresponding to the steps described in the flowchart of FIG. 10, which is the same as that shown in FIG. 11 except that an oxidized metal sublayer structure is formed over the spacer layer.

A special iterative process 1190 is then utilized to form an insulator made of an oxidized metal sublayer structure over and adjacent spacer layer portion 1132 (step 1006 of FIG. 10). This process 1190 will be described in more detail later in relation to FIGS. 23-27. The result is shown in FIG. 12, where an insulator 1140 made of the oxidized metal sublayer structure is formed in contact with spacer layer portion 1132. The oxidized metal sublayer structure of insulator 1140 includes a plurality of thin oxidized metal sublayers, each sublayer of which makes direct contact with its adjacent sublayer. Since it will form part of the spacer layer structure, insulator 1140 is formed with a very small thickness such as between 10 Angstroms (Å) and 100 Å. Insulator 1140 may be formed with any suitable oxidized metal sublayers, such as oxidized tantalum (TaOx) sublayers. Other metal sublayers, described later below, may be suitable as well. As will be described later in further variations, insulator 1140 may alternatively be made of a plurality of nitrided metal sublayers, or a plurality of oxynitrided metal sublayers.

Figure 13:
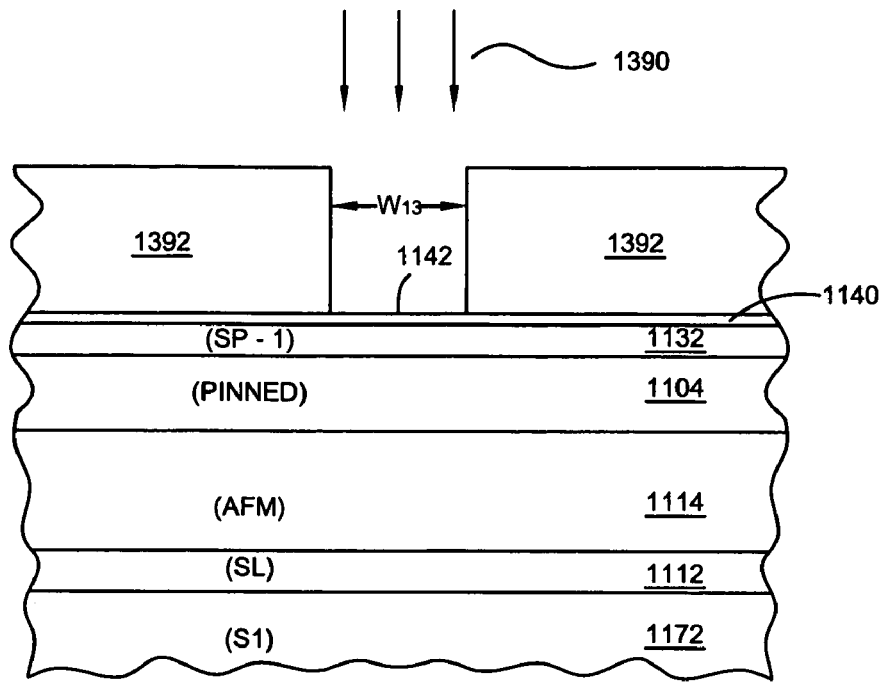
FIG. 13 is the third in a series of ABS illustrations of FIGS. 11-15 of partially fabricated sensor structures corresponding to the steps described in the flowchart of FIG. 10, which is the same as that shown in FIG. 12 except a resist structure is applied and patterned on top of the oxidized metal sublayer structure exposing materials of the structure.

A resist structure formation process 1290 is then performed, where in FIG. 13 a resist structure 1392 is applied and patterned over and adjacent insulator 1140 exposing insulator materials 1142 of insulator 1140 (step 1008 of FIG. 10). Resist structure 1392 may be made from a photoresist. Alternatively, resist structure 1392 may be made from a resist which is compatible with electron beam (e-beam) lithography processes. Although resist structure 1392 is shown and described as a monolayer resist, it may alternatively be a multi-layered resist (e.g. bilayer or trilayer resist). As shown, resist structure 1392 is formed to define an opening having an appropriate width $W_{13}$ for a subsequently-formed lithographically-defined conductive via. If photolithography is used to form resist structure 1392, a thin film of resist is light-exposed in regions which are to be removed, provided the resist is a positive resist. If the resist is a negative resist, it is light-exposed in regions that are to be retained. Finally, the resist is subjected to a basic developer solution. If electron beam (e-beam) lithography is used to form resist structure 1392, a thin film of resist is e-beam-exposed in regions which are to be removed, provided the resist is a positive resist. If the resist is a negative resist, it is light-exposed in regions that are to be retained. Finally, the resist is subjected to a suitable developer solution. Width $W_{13}$, which will ultimately determine the width of the resulting conductive via, may be within 3 and 40 nanometers (nm). In this embodiment, only a single opening is formed within a center of resist structure 1392 (which is at a centerline of the width of sensor stack structure 1100 and the trackwidth of the resulting read sensor). However, the number of openings will vary depending on the number of vias desired.

Figure 14:
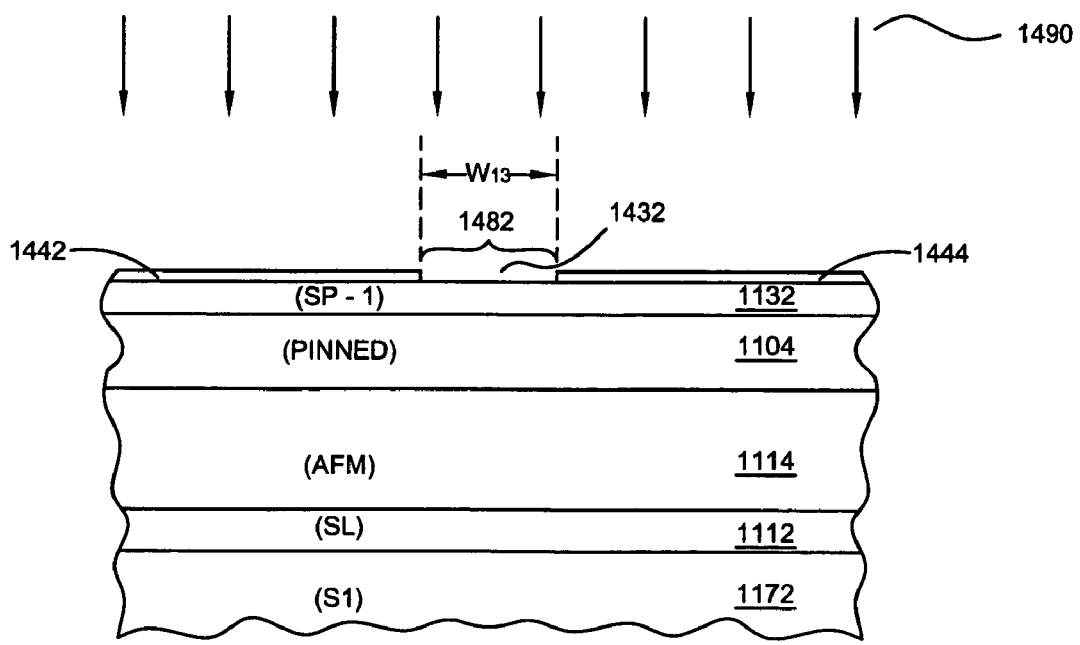
FIG. 14 is the fourth in a series of ABS illustrations of FIGS. 11-15 of partially fabricated sensor structures corresponding to the steps described in the flowchart of FIG. 10, which is the same as that shown in FIG. 13 except that the exposed oxidized metal materials are removed and a via is formed through the oxidized metal sublayer structure.

With resist structure 1392 in place, an etching process 1390 (e.g. ion milling) is utilized to remove exposed insulator materials 1142 through the opening of resist structure 1392 (step 1010 of FIG. 10). The result is shown in FIG. 14, where an aperture 1482 is formed down to the top of spacer layer portion 1132 to expose electrically conductive materials 1432 thereof. If the etching is performed along the entire stripe height (SH) dimension, the insulator layer may be completely separated into first and second insulator layer portions 1442 and 1444. The ion milling process is discontinued once the top of spacer layer portion 1132 is reached, where electrically conductive materials 1432 of spacer layer portion 1132 are exposed. Thus, aperture 1482 is formed down through the entire insulator layer, is surrounded by insulator layer portions 1442 and 1444, and has substantially the same width $W_{13}$ as the opening of the resist structure. FIG. 14 also reveals that the resist structure may be removed at this time using a suitable solvent or other suitable technique.

Figure 15:
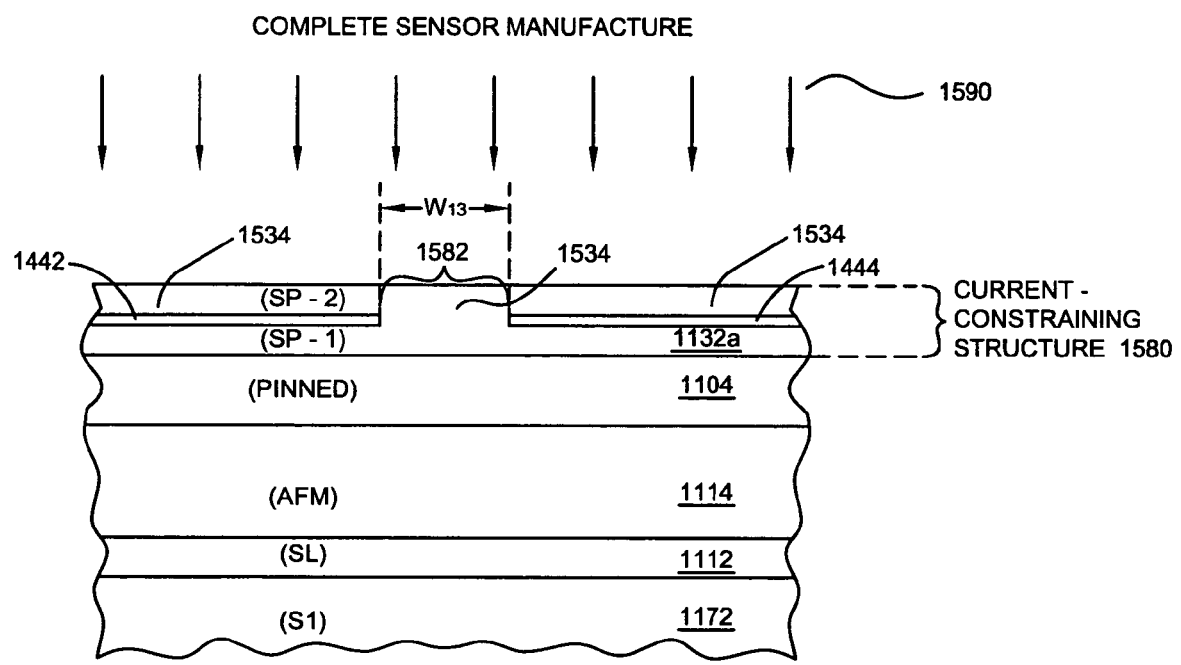
FIG. 15 is the fifth in a series of ABS illustrations of FIGS. 11-15 of partially fabricated sensor structures corresponding to the steps described in the flowchart of FIG. 10, which is the same as that shown in FIG. 14 except electrically conductive materials are formed within the via and over the oxidized metal sublayer structure to thereby form a current-constraining structure having a lithographically-defined conductive via.

A deposition process 1490 is then performed to deposit electrically conductive materials within aperture 1482 over exposed electrically conductive materials 1432 (step 1012 of FIG. 10). The result is shown in FIG. 15, where electrically conductive materials 1534 are not only formed within aperture 1482 but also over insulator layer portions 1442 and 1444. As a result, a lithographically-defined conductive via 1582 of a current-constraining structure 1580 is formed. Electrically conductive materials 1534 which are formed above lithographically-defined conductive via 1582 and over insulator portions 1442 and 1444 form a top portion or top sublayer (SP-2) of the entire spacer layer structure. In this embodiment, only a single via is formed within a center of the structure (which is at a centerline of the width of sensor stack structure 1100 and the trackwidth of the resulting read sensor). However, the number of vias will vary depending on the design. Note that deposition process 1490 of FIG. 14 may alternatively be performed with resist structure 1392 kept in place until aperture 1432 is filled with the electrically conductive materials to form a flat top surface with insulator portions 1442 and 1444. After aperture is filled with the electrically conductive materials to form the via, resist structure 1392 is removed and the remaining electrically conductive materials are deposited to form the top sublayer of the spacer layer.

The method corresponding to the steps described in the flowchart of FIG. 10 ends at an end block 1014, but additional processing steps may be subsequently performed. For example, additional manufacturing processes 1590 are utilized to complete the formation of the CPP read sensor, shown in FIG. 16 as a CPP read sensor 1600. These processes 1590 may utilize any suitable techniques known in the art (conventional or otherwise) to complete the manufacturing per the design requirements.

Figure 16:
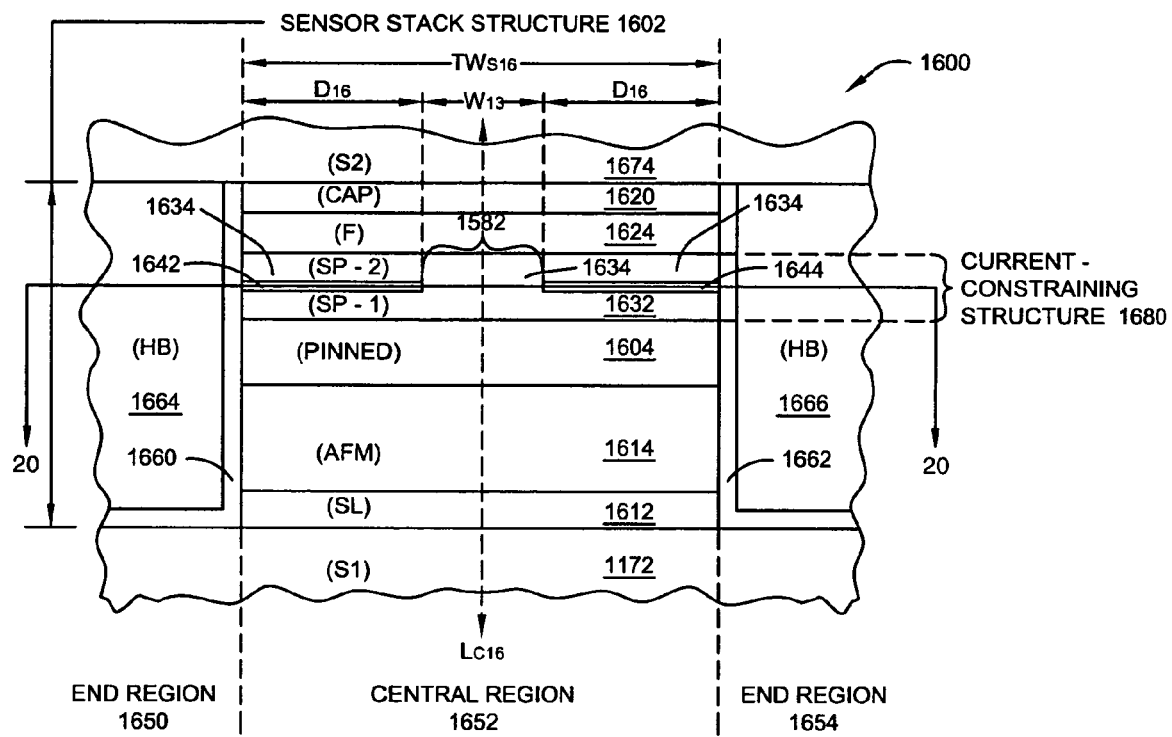
FIG. 16 is an ABS illustration showing a CPP read sensor of an exemplary embodiment.

As shown in FIG. 16, the resulting CPP read sensor 1600 made from the above-described methods has a sensor stack structure 1602 ("bottom-SV") formed in a central region 1652 surrounded by end regions 1650 and 1654. Sensor stack structure 1602 includes, from bottom to top, a seed layer 1612, an AFM pinning layer 1614, a pinned layer structure 1604, a current constraining structure 1680, a sensing layer structure (F) 1624 and a capping layer 1620. Capping layer 1620 is formed below and adjacent second shield layer 1674 and over and adjacent sensing layer structure 1624. Sensing layer structure 1624 is formed below and adjacent capping layer 1620 and over and adjacent current-constraining structure 1680. Current-constraining structure 1680 is formed below and adjacent sensing layer structure 1624 and above and adjacent pinned layer structure 1604. Pinned layer structure 1604 is formed below and adjacent current-constraining structure 1680 and over and adjacent AFM pinning layer 1614. AFM pinning layer 1614 is formed below and adjacent pinned layer structure 1604 and over and adjacent seed layer 1620. Seed layer 1612 is formed over and adjacent first shield layer 1172 and below and adjacent AFM pinning layer 1614 for promoting an improved texture of the layers deposited thereon. CPP read sensor 1600 has first and second insulator layers 1660 and 1662 formed in end regions 1650 and 1654 over and adjacent first shield layer 1172, as well as, sidewalls of sensor stack structure 1602. Furthermore, CPP read sensor 1600 has first and second hard bias layers 1664 and 1666 formed over and adjacent insulator layers 1660 and 1662. Finally, second shield layer (S2) 1674 is shown formed over the planarized structure.

Note that, instead of current-constraining structure 1680 being formed within the entire spacer layer, it may be formed on top of or below the spacer layer. In this variation, the lithographically-defined conductive via may be formed from the same or different non-magnetic conductive materials of the spacer layer or from the ferromagnetic materials of the underlying/overlying magnetic layers.

A CPP read sensor having current-constraining structure with one or more lithographically-defined conductive vias has advantages. Most importantly, the lithographically-defined conductive vias increase the current density of the read sensor in the region of the sensing layers to thereby simultaneously increase its resistance and magnetoresistance. Especially as the dimensions of read sensors are decreasing, a tighter control over the current density requirement of the read sensor may be achieved by design and during fabrication. The size and number of vias may be varied and selected so as to precisely "tune" the sensor's resistance and magnetoresistance. As there is increasing evidence that the magnetoresistive effect is reduced near edges of the read sensor from milling damage, it is also advantageous to isolate a single or few vias in the center of the sensor structure to avoid such damage.

Materials, Structure, and Variations on the Conductive Vias in FIGS. 16-21. The following materials may be utilized in CPP read sensor 1600 of FIG. 16. First and second shields 1172 and 1674 may be made of any suitable material such as nickel-iron (NiFe); seed layer 1612 may have one or more layers of any suitable material such as nickel-iron-chromium (NiFeCr) or NiFe; AFM pinning layer structure 1614 may be made of any suitable material, such as platinum manganese (PtMn) or alternatively iridium manganese (IrMn); pinned layer structure 1604 may be made of any suitable material such as cobalt (Co) or cobalt-iron (CoFe) or Heusler alloys (e.g. $Co_2MnGe$); electrically conductive portions 1632 and 1634 of current-constraining structure 1680 may be made of any suitable material such as copper (Cu) or gold (Au), while insulating portions 1642 and 1644 of current-constraining structure 1680 may be made of any suitable material such as oxidized tantalum (TaOx); sensing layer structure 1624 may be made of any suitable material such as CoFe or alternatively NiFe or Heusler alloys (e.g. $Co_2MnGe$); capping layer 1620 may be made of any suitable material such as tantalum (Ta); first and second insulator layers 1660 and 1662 may be made of any suitable material such as $Al_2O_3$; first and second hard bias layers 1664 and 1666 may be made of any suitable material such as cobalt-platinum-chromium (Co—Pt—Cr) or other Co-based alloy.

The following thicknesses of the various layers may be utilized in CPP read sensor 1600. First and second shields 1172 and 1674 may have a thickness range of about 30 nm to about 500 nm; seed layer 1612 may have a thickness range of about 10 Å to about 100 Å; AFM pinning layer structure 1614 may have a thickness range of about 30 Å to about 300 Å; pinned layer structure 1604 may have a thickness range of about 10 Å to about 100 Å; electrically conductive portions 1632 and 1634 of current-constraining structure 1680 may have a thickness range of about 2 Å to about 10 Å respectively, insulating portions 1642 and 1644 of current-constraining structure 1680 may have a thickness range of about 5 Å to about 100 Å, and lithographically-defined conductive via 1582 may have a thickness range of about 5 Å to about 100 Å; sensing layer structure 1624 may have a thickness range of about 10 Å to about 100 Å; capping layer 1620 may have a thickness range of about 5 Å to about 50 Å; first and second insulator layers 1660 and 1662 may have a thickness range of about 10 Å to about 100 Å; and first and second hard bias layers 1664 and 1666 may have a thickness range of about 20 nm to about 200 nm.

As shown, current-constraining structure 1680 of this exemplary embodiment is formed as part of or within a spacer layer having a first spacer layer portion (SP-1) and a second spacer layer portion (SP-2). First spacer layer portion SP-1 is formed adjacent sensing layer structure 1624 (which is located above it), and second spacer layer portion SP-2 is formed adjacent pinned layer structure 1604 (which is located below it). In this embodiment, current-constraining structure 1680 has a single lithographically-defined conductive via 1582 surrounded by insulator portions 1642 and 1644 and is located in a center of the structure. However, any suitable number of preferably equally-distributed vias may be incorporated within current-constraining structure 1680 as will be shown and described later in relation to FIGS. 17 and 18.

Width $W_{13}$ of lithographically-defined conductive via 1582 may be defined relative to a trackwidth $TW_{S16}$ of CPP read sensor 1600. Preferably, width $W_{13}$ of lithographically-defined conductive via 1582 is less than or equal to ½ of a trackwidth $TW_{S16}$ of CPP read sensor 1600. In this embodiment, the trackwidth $TW_{S16}$ is about 100 nm (with a range of 30 to 200 nm) and width $W_{13}$ is about 10 nm (with a range of 3 to 40 nm). FIG. 16 reveals more clearly that lithographically-defined conductive via 1582 is formed at a centerline $L_{C16}$ of the width of sensor stack structure 1602 and trackwidth $TW_{S16}$ of CPP read sensor 1600. For the single conductive via, note that a distance $D_{16}$ defines the width of each insulator material portion 1642 and 1644 where $W_{13}+(2*D_{16})=TW_{S16}$.

Figure 19:
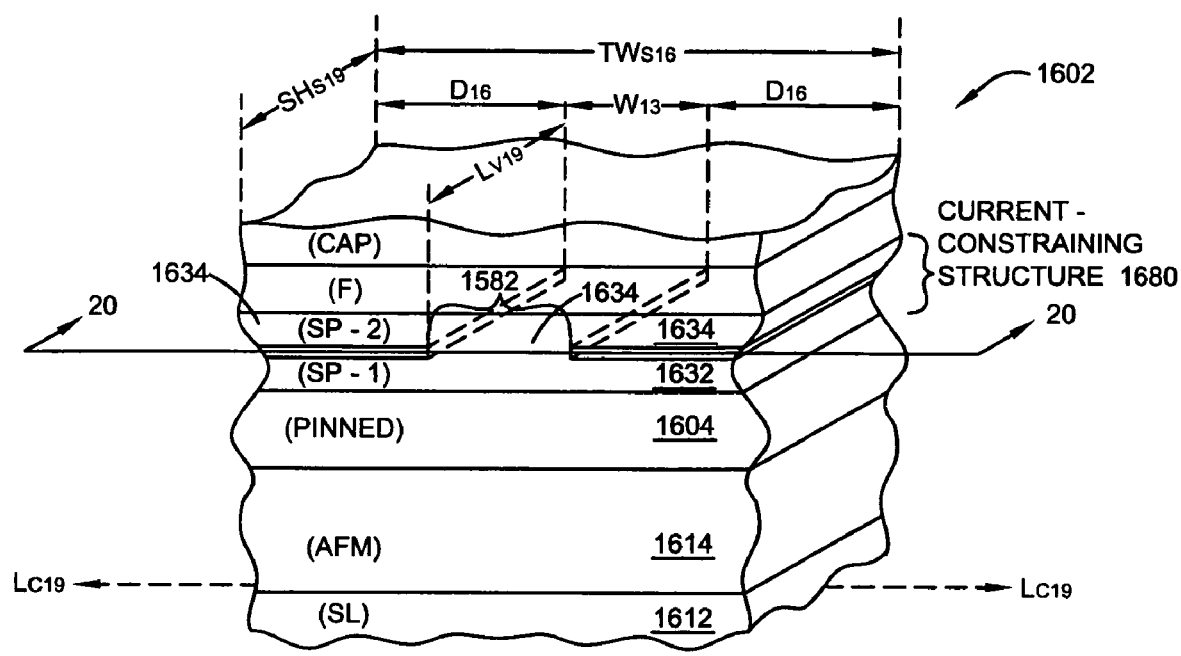
FIG. 19 is an isometric view of the CPP read sensor of the exemplary embodiment of FIG. 16, revealing exemplary trackwidth and stripe height dimensions of the lithographically-defined conductive via.
Figure 20:
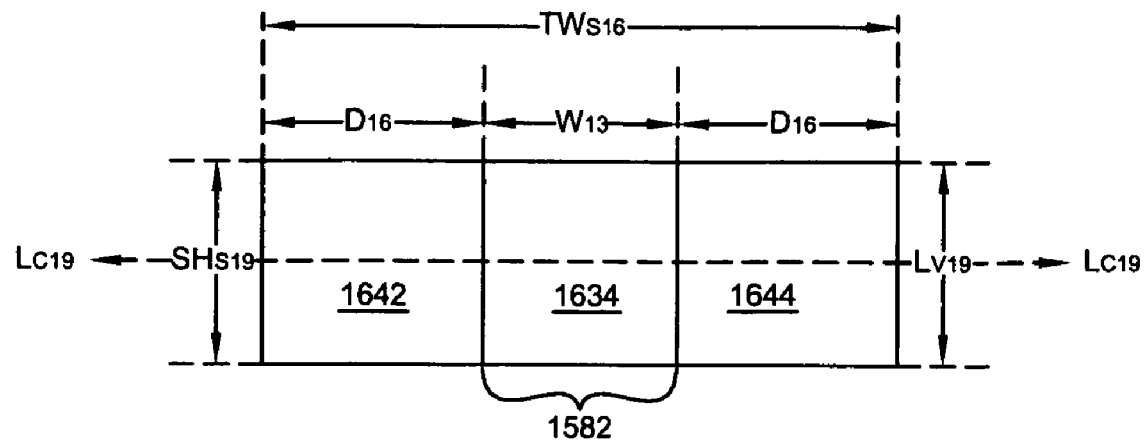
FIG. 20 is a top down view of the current-constraining structure of FIG. 16 and 19, revealing exemplary trackwidth and stripe height dimensions of the lithographically-defined conductive via.
Figure 21:
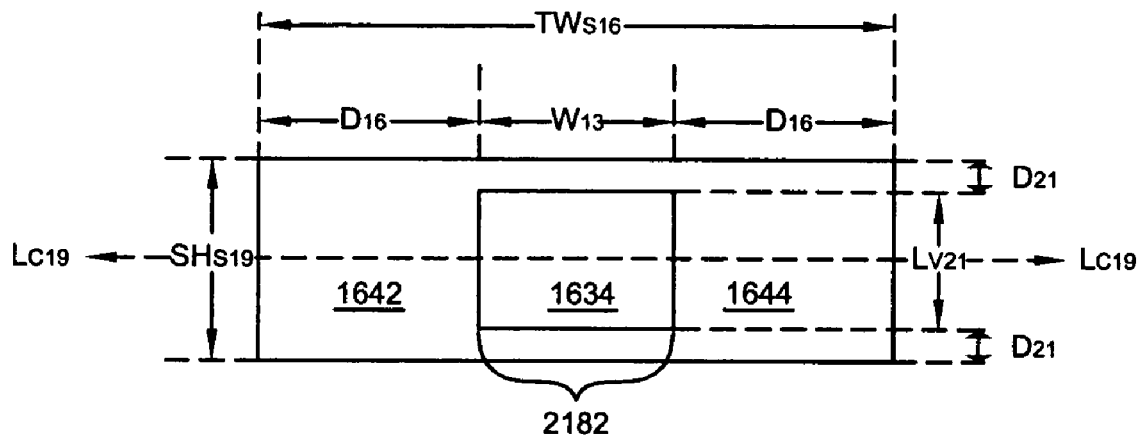
FIG. 21 is a top down view of one variation on the stripe height dimension of the lithographically-defined conductive via of FIGS. 16 and 19-20.

The dimension of lithographically-defined-conductive via 1582 in the stripe height (SH) direction is now discussed in relation to FIGS. 19, 20, and 21. In FIG. 19, an isometric illustration of sensor stack structure 1602 is shown. As illustrated, sensor stack structure 1602 has a stripe height $SH_{S19}$ associated with it and lithographically-defined conductive via 1582 has a dimension $L_{V19}$ in the stripe height direction. In this embodiment, $L_{V19}=SH_{S19}$. More generally, dimension $L_{V19}$ is equal to or less than the stripe height $SH_{S19}$. A top down illustration taken along line 20-20 of FIGS. 16 and 19 is shown in FIG. 20, which reveals that lithographically-defined conductive via 1582 is formed at a centerline $L_{C19}$ of stripe height $SH_{S19}$ of sensor stack structure 1602. In FIG. 21, a top down illustration of a variation of this exemplary embodiment is shown. Again, a lithographically-defined conductive via 2182 has a dimension $L_{V21}$ in the stripe height direction. In the embodiment of FIG. 21, dimension $L_{V21}$ of lithographically-defined conductive via 2182 is less than the stripe height $SH_{S20}$. In this case, a distance $D_{21}$ defines the height of each insulator material portion where $L_{V21}+(2*D_{21})=SH_{S19}$. For the single conductive via embodiment, lithographically-defined conductive via 2182 is formed at a centerline $L_{C19}$ of stripe height $SH_{S19}$ of sensor stack structure 1602.

Figure 17:
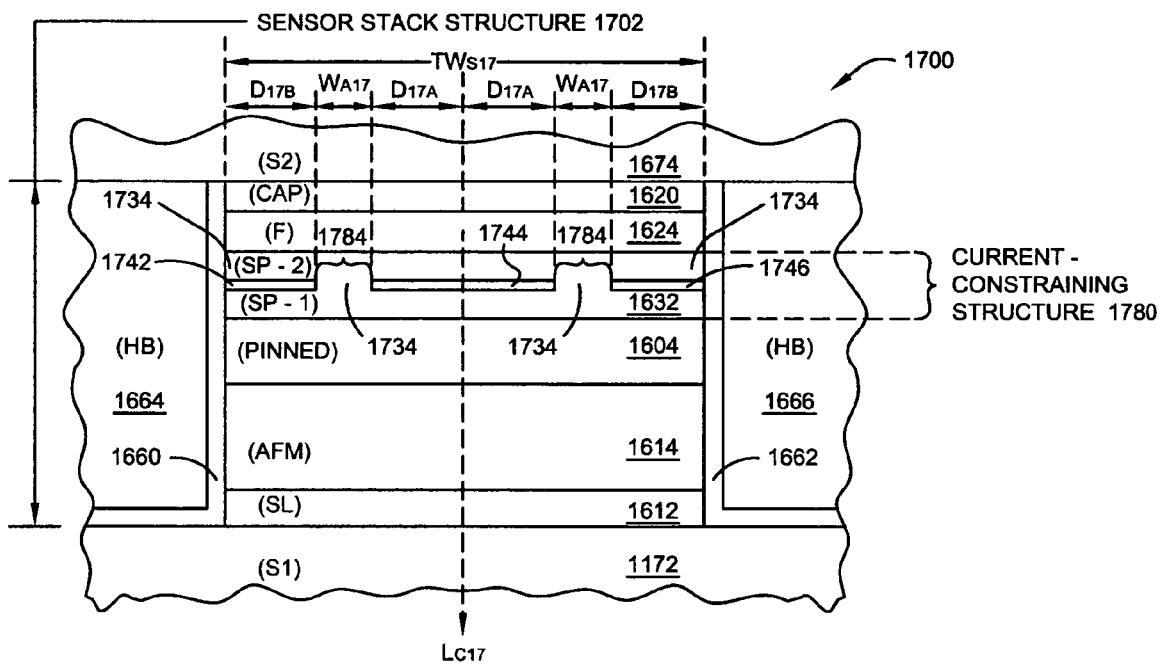
FIG. 17 is an ABS illustration showing a CPP read sensor of an alternative embodiment, which is the same as that shown in FIG. 16 except the current-constraining structure has two lithographically-defined conductive vias.

Referring now to FIG. 17, an alternate embodiment of a CPP read sensor 1700 of the present disclosure is shown. FIG. 17 is the same as that shown and described in relation to FIG. 16 except for differences in a current-constraining structure 1780 of CPP read sensor 1700. In particular, current-constraining structure 1780 is formed with two lithographically-defined conductive via 1782 and 1784 which are equally spaced apart from a centerline LC17 of a width of sensor stack structure 1702 and a trackwidth S17 of CPP read sensor 1700. Similar to FIG. 16, current-constraining structure 1780 is part of a spacer layer structure which has a first spacer layer portion (SP-1) and a second spacer layer portion (SP-2), where the second spacer layer portion SP-2 is formed adjacent sensing layer structure 1624 (which is positioned above it) and the first spacer layer portion SP-1 is formed adjacent pinned layer structure 1604 (which is positioned below it). Lithographically-defined conductive vias 1784 and 1784 have conductive materials 1734 formed within them, parts of which make up the spacer layer. Lithographically-defined conductive via 1782 is surrounded by insulator materials 1742 on the left and insulator materials 1744 on the right. Similarly, lithographically-defined conductive via 1784 is surrounded by insulator materials 1744 on the left and insulator materials 1746 on the right.

In this embodiment, each width $W_{A17}$ of lithographically-defined conductive via 1782 and 1784 is chosen such that $(2*W_{A17})$ is less than or equal to ½ of a trackwidth $TW_{S17}$ of CPP read sensor 1700. Lithographically-defined conductive vias 1782 and 1784 are formed equally spaced apart from the centerline $L_{C17}$ of trackwidth $TW_{S17}$ of sensor stack structure 1702 by a distance $D_{17A}$ where $(2*W_{A17})+(2*D_{17A})+(2*D_{17B})=TW_{S17}$. Note that distance $D_{17B}$ may be equal to, less than, or greater than distance $D_{17A}$. As discussed in relation to FIGS. 20-22, lithographically-defined conductive vias 1782 and 1784 have stripe height dimensions as well which may vary.

A method for making such a structure of FIG. 17 is the same as that described earlier in relation to FIG. 10, except current-constraining structure 1780 is formed having the two lithographically-defined conductive vias 1782 and 1784. Here, the photoresist structure is formed with two openings (e.g. in FIGS. 12-13), etching is performed to create two apertures (e.g. in FIGS. 13-14), and deposition is performed within the two apertures (e.g. in FIGS. 14-15).

Figure 18:
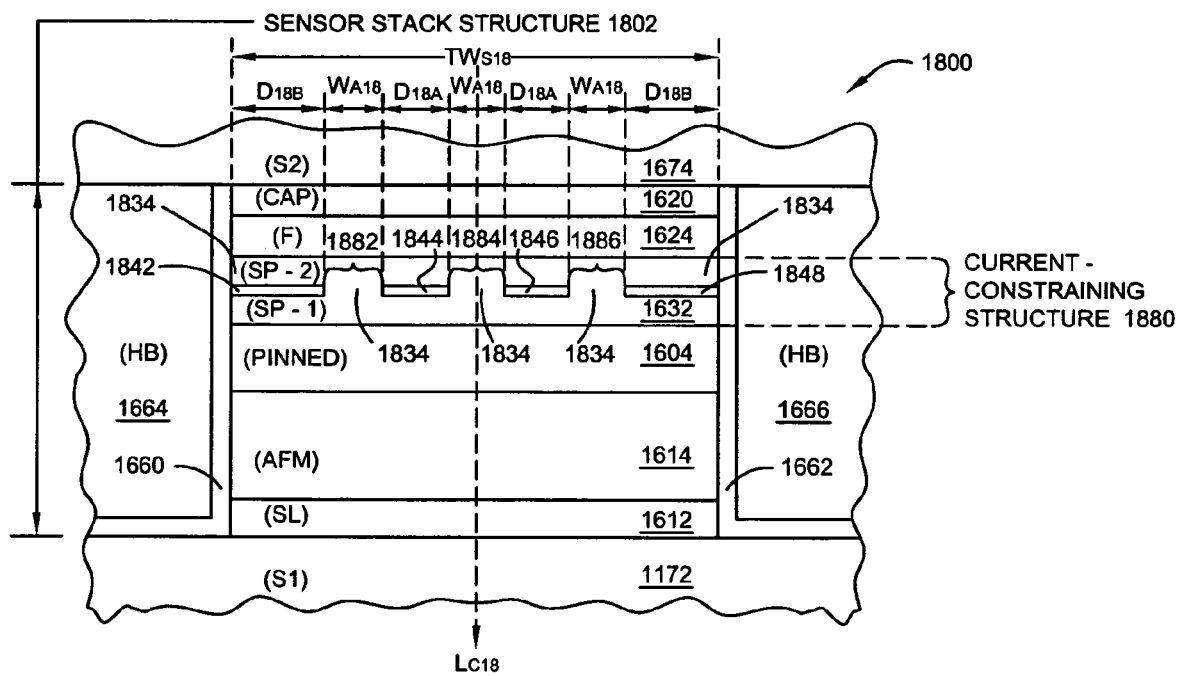
FIG. 18 is an ABS illustration showing a CPP read sensor of an alternative embodiment, which is the same as that shown in FIG. 16 except the current-constraining structure has three lithographically-defined conductive vias.

Referring ahead to FIG. 18, an alternate embodiment of a CPP read sensor 1800 of the present disclosure is shown. FIG. 18 is the same as that shown in FIG. 16, except for differences in a current-constraining structure 1880 of CPP read sensor 1800. In particular, current-constraining structure 1780 is formed with three lithographically-defined conductive vias 1882, 1884, and 1886 which are equally spaced apart from a centerline $L_{C18}$ of a width of sensor stack structure 1702 and a trackwidth $TW_{S17}$ of CPP read sensor 1700 Similar to FIGS. 16-17, current-constraining structure 1880 is part of a spacer layer structure which has a first spacer layer portion (SP-1) and a second spacer layer portion (SP-2), where the second spacer layer portion SP-2 is formed adjacent sensing layer structure 1624 (which is located above it) and the first spacer layer portion SP-1 is formed adjacent pinned layer structure 1604. Lithographically-defined conductive vias 1882, 1884, and 1886 have conductive materials 1834 formed within them, parts of which make up the spacer layer structure. Lithographically-defined conductive via 1882 is surrounded by insulator materials 1842 on its left and insulator materials 1844 on its right. Similarly, lithographically-defined conductive via 1884 is surrounded by insulator materials 1844 on its left and insulator materials 1846 on its right. Also similarly, lithographically-defined conductive via 1886 is surrounded by insulator materials 1846 on its left and insulator materials 1848 on its right.

In this embodiment, each width $W_{A18}$ of lithographically-defined conductive vias 1882, 1884 and 1886 is chosen such that $(3*W_{A18})$ is less than or equal to ½ of a trackwidth $TW_{S18}$ of CPP magnetic head 1800. Lithographically-defined conductive via 1884 is formed at the centerline $L_{C18}$ of trackwidth $TW_{S18}$ of sensor stack structure 1802, whereas lithographically-defined conductive vias 1882 and 1886 are formed equally spaced apart from the centerline $L_{C18}$ by a distance $D_{18A}$ where $(3*W_{A18})+(2*D_{18A})+(2*D_{18B})=$trackwidth $TW_{S18}$. Note that distance $D_{18B}$ may be equal to, less than, or greater than distance $D_{18A}$. As discussed in relation to FIGS. 20-22, lithographically-defined conductive vias 1882, 1884 and 1886 have stripe height dimensions as well which may vary.

A method for making such a structure of FIG. 18 is the same as that described in relation to FIG. 10, except current-constraining structure 1880 is formed having the three lithographically-defined conductive vias 1884, 1884, and 1886. Here, the photoresist structure is formed with three openings (e.g. in FIGS. 12-13), etching is performed to create three apertures (e.g. in FIGS. 13-14), and deposition is performed within the three apertures (e.g. in FIGS. 14-15).

Figure 22:
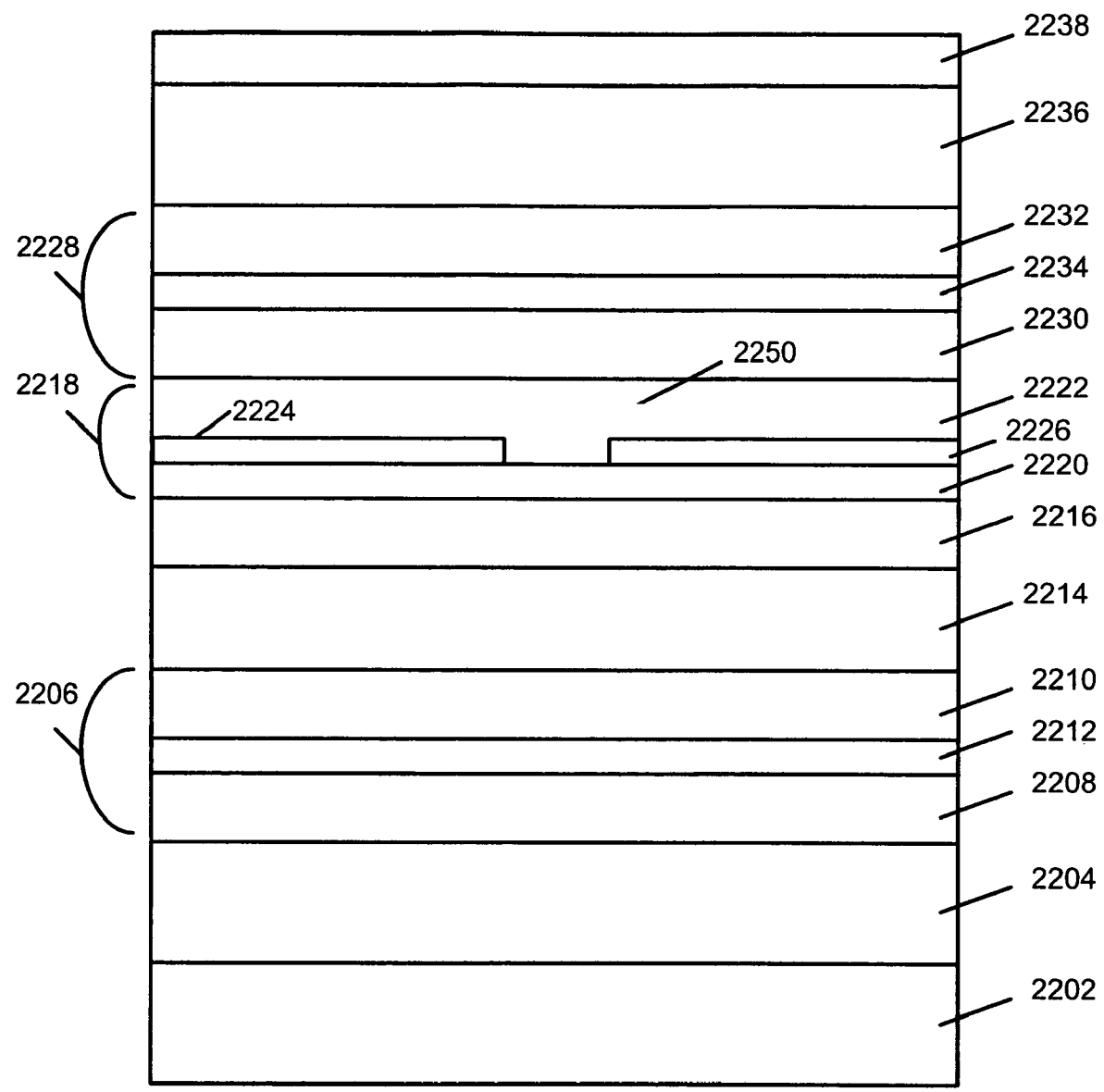
FIG. 22 is an ABS illustration showing a CPP read sensor of an alternative embodiment.

The CPP sensors of the present disclosure may include all layers shown and described in relation to FIGS. 16-19. However, one skilled in the art understands the layers described in relation to FIGS. 16-19 are but a few examples of all possible CPP sensor layer configurations. For example, the CPP sensors are shown as top-type CPP sensors; however the sensors may be bottom-type CPP sensors. Alternative configurations may include dual CPP sensors, in-stack biasing structures, AP-pinned layer structures, and AP-sensing layer structures, to name a few. In FIG. 22, another embodiment is shown of a dual CPP sensor 2200 which includes a current-constraining structure of the present disclosure. As shown in FIG. 22, sensor 2200 includes, from bottom to top, a seed layer structure 2202 (e.g. Ta/NiFeCr); an antiferromagnetic (AFM) pinning layer 2204 (e.g. IrMn); an antiparallel (AP) pinned layer structure 2206 which includes a first ferromagnetic (FM) layer 2208 (e.g. CoFe), a second FM layer 2210, and an antiparallel coupling (APC) layer 2212 (e.g. Ru) between layers 2208 and 2210; a spacer layer 2214 (e.g. Cu); a free (or sensing) layer 2216 (e.g. Co$_2$MnGe); a spacer layer structure 2218 (within which an electrically-conductive via 2250 of the current-constraining structure is formed) which includes a first spacer layer portion 2220 (e.g. Cu), a second spacer layer portion 2222 (e.g. Cu), and oxidized metal sublayer structures 2224 and 2226 (e.g. TaOx sublayers); an AP pinned layer structure 2228 which includes a first FM layer 2230 (e.g. CoFe), a second FM layer 2232, and an APC layer 2234 (e.g. Ru) between layers 2230 and 2232; an AFM pinning layer 2236 (e.g. IrMn); and a cap layer 2238 (e.g. Ta).

Further structural variations may also be made. As described above, the current-constraining structure may be formed adjacent the sensing layer structure, or within or adjacent the capping layer structure. Alternatively, the current-constraining structure may be formed adjacent the pinned layer structure or the AFM pinning layer structure. Also described above, the lithographically-defined conductive via may be formed within the spacer layer. Alternatively, however, the lithographically-conductive via may be formed on top of or below the spacer layer, or on top of or below the capping layer.

Particular attention in the description was placed on the relative location of the lithographically-defined conductive vias. Specifically, the above embodiments describe the location of the lithographically-defined conductive vias at or equally spaced apart from the centerline of the trackwidth of the sensor stack structure and/or the centerline of the stripe height of the sensor stack structure. Alternatively, the lithographically-defined conductive vias of the present disclosure may be formed in any suitable location for proper current flow, as in adjacent the ABS. Furthermore, as discussed specifically in relation to FIG. 22, a current-constraining structure of the present disclosure may have lithographically-defined conductive vias with dimensions in the stripe height direction that are less than that of the stripe height. However, other configurations are possible. For example, a two-dimensional matrix (as viewed from top-down) of lithographically-defined conductive vias may be formed within the current constraining structure. In addition, multiple current-constraining structures of the present disclosure may be utilized per the desires of the user.

Oxidized Metal Sublayer Structure Formation of FIGS. 23-27 for Step 1006 of FIG. 10. Conventional approaches and issues in the formation of oxidized metals from deposited metals are first discussed. Such conventional methods of forming such oxidized metals involve the steps of depositing a metallic layer (e.g. between about 20 Å and about 40 Å) in-situ and subsequently exposing that metallic layer to oxygen ex-situ to ambient atmosphere. The depth of oxygen (O) diffusion into the metallic layer is difficult to precisely control. Furthermore, the form in which the diffused oxygen is found (if at all) throughout such layer is of importance to sensor performance. Consider the use of tantalum (Ta) as the metal where it is subsequently oxidized. The oxygen may diffuse only to a certain depth into the metallic layer since the ex-situ oxidation is from the top. Only an upper portion of the metallic layer may be sufficiently oxidized from the ex-situ oxidation. In the upper portion of the layer, the diffused oxygen may be strongly bonded to the Ta in the Ta lattice due to the formation of Ta—O valence bonds, as in the stable compound tantalum oxide (Ta$_2$O$_5$). In a middle portion of the metallic layer, the diffused oxygen may be loosely bonded in a lower concentration than that found in the upper portion, probably in interstitial sites of the Ta lattice. Non-bonded Ta atoms may also be present in the middle portion of the metallic layer. In a lower portion of the metallic layer, diffused oxygen may not be found in any appreciable concentration (i.e. the lower portion may be substantially pure Ta). As in the middle portion, non-bonded Ta atoms may be present in the lower portion. This non-bonded Ta may diffuse into underlying ferromagnetic materials (such as a free or sensing layer structure), and therefore create a magnetic dead layer within the ferromagnetic materials. As apparent, the atomic percent oxygen in the resulting structure will not be uniform throughout from top to bottom, especially in a relatively thick deposited structure. On the other hand, if the ex-situ oxidation is thorough, the thoroughly-diffused oxygen in the metallic layer will be strongly bonded to all of the Ta in the Ta lattice due to the formation of Ta—O valence bonds, as in the stable compound Ta$_2$O$_5$. This Ta—O valence bonding increases the thickness of the layer by a factor of about 2½ times (i.e. Ta$_2$O$_5$ layer thickness is 2.5 times thicker than the Ta layer thickness). However, underlying ferromagnetic materials may become partially oxidized and form a magnetically "dead" layer from the diffusion of non-bonded oxygen into it. If the layer were to be sufficiently oxidized uniformly from top to bottom without un-bonded Ta or oxygen diffusion into underlying ferromagnetic materials, the sensor properties may be enhanced as mentioned above. Note that uniform oxidation performed subsequent to metallic layer deposition is practical with metallic layer thicknesses of about 10 Å or less, which is below conventional thickness requirements for a spacer layer between about 20 Å and about 100 Å.

Figure 23:
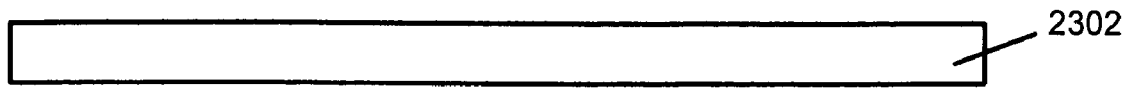
FIG. 23 is the first in a series of ABS illustrations of FIGS. 23-27 of partially fabricated oxidized metal sublayer structures corresponding to step 1006 of FIGS. 10-11, showing that an electrically conductive spacer layer is formed.
Figure 24:
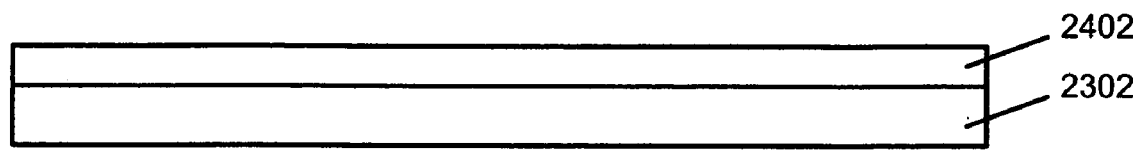
FIG. 24 is the second in a series of ABS illustrations of FIGS. 23-27 of partially fabricated oxidized metal sublayer structures corresponding to step 1006 of FIGS. 10-11, which is the same as that shown in FIG. 23 except that a metal sublayer is deposited over the spacer layer.

The formation of an insulator made of the oxidized metal sublayer structure of the present disclosure is now described in more detail in relation to FIGS. 23-27. This process may be used in step 1004 of FIG. 10 to create insulator 1140 of FIG. 11. In FIG. 23, a sensor stack structure having an electrically conductive spacer layer 2302 (e.g. Cu) is formed. Next, an insulator made of an oxidized metal sublayer structure (such as that described in relation to FIG. 11) is formed over spacer layer 2302. Using a deposition process, metallic materials (e.g. Ta) are deposited over and in contact with spacer layer 2302. The result is a metallic sublayer 2402 shown in FIG. 24. Preferably, the deposition process is a physical vapor deposition process (PVDP) performed in a deposition chamber module. In this exemplary embodiment, the deposition process of metallic sublayer 2402 is accomplished in an atmosphere of argon (Ar) with a sputtering flow of 20 standard cubic centimeters (sccm). The deposition process may alternatively be any suitable thin film deposition process, such as ion beam sputtering, evaporation or another similar method. Furthermore, any other suitable metal or combinations of metals may be substituted for Ta in metallic sublayer 2402 and well as any suitable thickness.

After metallic sublayer 2402 is deposited, the gas is evacuated from the deposition chamber module. The work-in-progress is then moved, maintaining a vacuum, to an in-situ oxidization module. In the in-situ oxidization module, an oxidation process is performed on metallic sublayer 2402. As a result, in FIG. 25 an oxidized metallic sublayer 2502 is shown to be formed. The oxidation process is preferably an in-situ plasma oxidation process, which is suitably controlled and timed such that a sufficiently oxidized tantalum oxide layer with uniform atomic percent oxygen throughout the layer from top to bottom is achieved. The reactant gas used in the oxidation process includes, for example, an oxygen having a flow of 4 sccm and argon having a flow of 20 sccm. The oxidation process for a 6⅔ Å Ta layer (which produces about 16⅔ Å of $Ta_2O_5$) may be performed for about 1 minute at room temperature. The RF power applied to the substrate may be 20 watts (W). However, the flow of oxygen in the reactant gas may vary from about 2 sccm to about 10 sccm and the RF power may vary from 10 W to 40 W, for example. Further, the oxidation process may be performed from about ¼ minutes to 6 minutes corresponding to a range of metallic sublayer thicknesses from about 1 Å to about 10 Å. Note that the oxidation process may alternatively utilize any suitable oxidation process, such as natural oxidation, radical shower oxidation, or reactive sputtering oxidation.

Next, it is identified whether the above steps need to be repeated. This will depend on the number of oxidized metallic sublayers desired. Repeating these steps forms a laminated layer structure, and more specifically the plurality of oxidized metallic sublayers of the insulator. In this example, the steps are repeated only once to produce a total of two (2) sublayers in the structure. In a repeated deposition process of FIG. 26, metallic materials are deposited over and adjacent oxidized metallic layer 2502. Preferably, this deposition process is the same deposition process using the same metallic materials utilized in deposition process of FIG. 2402. The result is shown in FIG. 26 where a metallic sublayer 2602 is formed over oxidized metallic sublayer 2502. A repeated oxidization process is then performed to transform metallic sublayer 2602 into an oxidized metallic sublayer 2702 shown in FIG. 27. Preferably, this oxidization process is the same oxidization process using the same components utilized in oxidization process of FIG. 25. As a result, an insulator is formed with a plurality of two oxidized metallic sublayers. In this embodiment, the insulator has a resulting thickness of about 20 Å.

The total thickness of the insulator, the sublayer thickness, the number of sublayers, the materials of each sublayer, and the processing of each sublayer may be chosen by design to achieve the specular reflective structure and give suitable desired effects on the magnetoresistive effect and other soft magnetic properties of the sensor. As the thicknesses of the sublayers may vary per the design, it is desired that any such process will oxidize each sublayer sufficiently from top to bottom without over-oxidizing. Thus, the variables for sufficient oxidation of each sublayer (e.g. time, flow rate, and power) are preferably selected and confirmed through empirical analysis prior to large-scale manufacturing. In particular, the values of the variables (e.g. time, flow rate, and power) which correspond to desired or optimal sensor performance are those selected for the oxidization for large-scale manufacturing. This is later discussed further in relation to the graphs of FIGS. 28-32.

Figure 25:
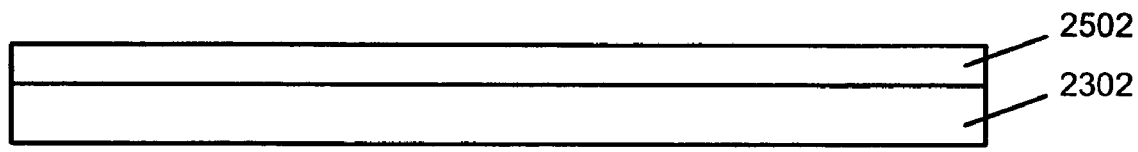
FIG. 25 is the third in a series of ABS illustrations of FIGS. 23-27 of partially fabricated oxidized metal sublayer structures corresponding to step 1006 of FIGS. 10-11, which is the same as that shown in FIG. 24 except that the metal sublayer is oxidized.
Figure 26:
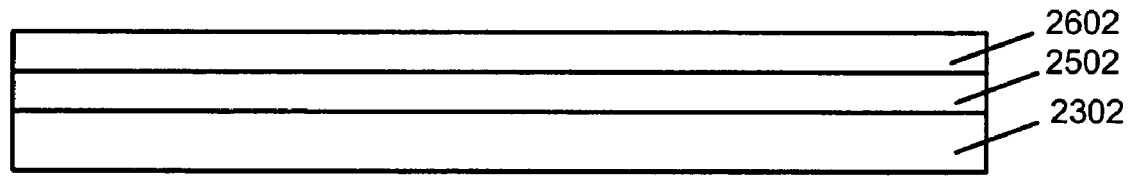
FIG. 26 is the fourth in a series of ABS illustrations of FIGS. 23-27 of partially fabricated oxidized metal sublayer structures corresponding to step 1006 of FIGS. 10-11, which is the same as that shown in FIG. 25 except that another metal sublayer is deposited over the previously-oxidized metal sublayer.
Figure 27:
FIG. 27 is the fifth in a series of ABS illustrations of FIGS. 23-27 of partially fabricated oxidized metal sublayer structures corresponding to step 1006 of FIGS. 10-11, which is the same as that shown in FIG. 26 except that the other metal sublayer is oxidized.

Note that the oxidation process associated with FIG. 25 may alternatively be a nitridation process or an oxynitridation process. In the case of the nitridation process, a metal nitride is formed. The nitridation process preferably is an in-situ plasma nitridation process, where a sufficiently nitrided metal layer with uniform atomic percent nitrogen is formed. The nitridation of a metallic layer by the nitridation process is suitably controlled and timed such that a sufficiently nitrided tantalum nitride layer with uniform atomic percent nitrogen throughout the layer from top to bottom is achieved. The nitridation process may alternatively be any suitable nitridation process such as natural nitridation, radical shower nitridation, or reactive sputtering nitridation. These processes may be performed in-situ with other processing steps. In the case of the oxynitridation process, a metal oxynitride is formed. The oxynitridation process preferably is an in-situ plasma oxynitridation process, where a sufficiently oxynitrided metal layer with uniform atomic percent oxygen and uniform atomic percent nitrogen is formed. The oxynitridation of a metallic layer by the oxynitridation process is suitably controlled and timed such that a sufficiently oxynitrided tantalum oxynitride layer with uniform atomic percent oxygen and uniform atomic percent nitrogen throughout the layer from top to bottom is achieved. The oxynitridation process may alternatively be any suitable oxynitridation process, such as natural oxynitridation, radical shower oxynitridation, or reactive sputtering oxynitridation. These processes may be performed in-situ with other processing steps. A DC magnetron system suitable for use in the method corresponding to FIGS. 23-27 may be sold by Anelva Technix Corporation of Japan. Alternatively, an magnetron/ion beam sputtering system may be purchased from Veeco Corporation of Plainview, N.Y.

Again, with use of the process of oxidation, nitridation, or oxynitridation on each metal sublayer, degradation of the spacer layer is reduced or eliminated such that the desirable soft magnetics of the free layer in the read sensor are maintained.

Note that the insulator comprising the oxidized metal sublayer structure is a specular reflective insulator structure. The sublayers are oxidized separate and apart from each other, therefore resulting in precise control over respective sublayer and structure characteristics. Advantageously, each oxidized metallic sublayer is sufficiently uniformly oxidized so as to increase the giant magnetoresistive effect and improve soft magnetic properties of the read sensor. This sensor is preferably embodied in a magnetic head and disk drive as described earlier in relation to FIGS. 1-9.

In general, the oxidized metal sublayer structure of the present disclosure has n sublayers, preferably each with an equal thickness $h_{12}$, such that $n*h_{12}$ is equal to a total thickness $H_{12}$ of $Ta_2O_5$. Total thickness $H_{12}$, sublayer thickness $h_{12}$, and the number of sublayers n may be chosen by design to give suitable desired effects on the magnetoresistive effect and other soft magnetic properties of the sensor. In one example, the oxidized metal sublayer structure has three sublayers. In this case, the oxidized metal sublayer structure has a total thickness $H_{12}$ corresponding to about 15 Å where each sublayer has an equal thickness $h_{12}$ corresponding to about 15 Å (3*5 Å=15 Å). Thus, the oxidized metal sublayer structure may have any suitable number of sublayers such as two, four, or more sublayers. Total thickness $H_{12}$ may be within a wide range of values (e.g. about 10 Å to about 100 Å), and thickness $h_{12}$ may also be within a wide range of values (e.g. about 2.5 Å to about 25 Å). As a further example, the oxidized metal sublayer structure may have four (4) sublayers where each sublayer has a thickness of about 5 Å for a total thickness of about 20 Å. As another example, the oxidized metal sublayer structure may have two (2) sublayers where each sublayer has a thickness of about 10 Å for a total thickness of about 20 Å. As yet another example, the oxidized metal sublayer structure may have four (4) sublayers where each sublayer has a thickness of about 16⅔ Å for a total thickness of about 66⅔ Å. As discussed, preferably the thickness of each sublayer is the same; however, the thickness of each sublayer may alternatively be different.

In the exemplary embodiment, the oxidized metal sublayer structure is a uniform structure of oxidized metal of tantalum, namely $Ta_2O_5$. Each sublayer is sufficiently independently oxidized from top to bottom into $Ta_2O_5$ so that the entire oxidized metal sublayer structure is a uniform structure of $Ta_2O_5$ from top to bottom. The diffused oxygen is strongly bonded to the Ta in the Ta lattice due to the formation of Ta—O valence bonds. Since each sublayer has uniform atomic percent oxygen from top to bottom, the entire oxidized metal sublayer structure has uniform atomic percent oxygen from top to bottom. Preferably, all of the sublayers of the oxidized metal sublayer structure are formed in direct contact with each other with no intervening layers or materials between them. With appropriate characterization techniques, the distinct interfaces between sublayers of the oxidized metal sublayer structure may be observed. Alternatively, intervening layers may exist between the sublayers.

Although Ta was discussed in relation to the structure, any suitable material may be used where the structure may still perform its appropriate function. Instead of Ta, for example, the metal used in the structure may be or include hafnium (Hf), zirconium (Zr), titanium (Ti), aluminum (Al), magnesium (Mg), yttrium (Y), chromium (Cr), niobium (Nb), molybdenum (Mo), tungsten (W), vanadium (V), rhenium (Re), scandium (Sc), or silicon (Si). As discussed, preferably the material of each sublayer is the same; however, the material of each sublayer may alternatively be different. Furthermore, combinations like alloys of two or more metals may be used. In binary and multi-component systems, such as the Ta and oxygen system, intermediate phases (stable or metastable) may occur. Thermodynamically, the composition of any such phase is variable and they are called stoichiometric phases. $Ta_2O_5$ is the preferred stoichiometric phase in the present disclosure due to its high stability and specular reflectivity. However, other stoichiometric phases in the Ta and oxygen system, such as tantalum monoxide (TaO) and tantalum dioxide ($TaO_2$) may be present as alternatives.

Instead of an oxide of metal (e.g. $Ta_2O_5$), a nitride of metal (e.g., TaN, $Ta_2N$, $Ta_3N_5$, etc.) may be utilized in the structure. In this embodiment, each sublayer is sufficiently independently nitrided from top to bottom into $Ta_2N$, so that the entire structure is uniform $Ta_2N$ from top to bottom. The diffused nitrogen is strongly bonded to the Ta in the Ta lattice due to the formation of Ta—N valence bonds. Since each sublayer has uniform atomic percent nitrogen from top to bottom, the entire structure has uniform atomic percent nitrogen from top to bottom. Also alternatively, an oxynitride of metal (e.g. TaON, etc.) may alternatively be used in the structure. In this embodiment, each sublayer is sufficiently independently oxidized/nitrided from top to bottom into TaON, so that the entire structure is uniform TaON from top to bottom. The diffused oxygen and nitrogen are strongly bonded to the Ta in the Ta lattice due to the formation of Ta—O—N valence bonds. Since each sublayer has a uniform atomic percent oxygen and uniform atomic percent nitrogen from top to bottom, the entire structure has uniform atomic percent oxygen and atomic percent nitrogen from top to bottom. Further, the sublayers of structures of the present disclosure may vary in composition being combinations of oxides, nitrides, and oxynitrides.

Figure 29:
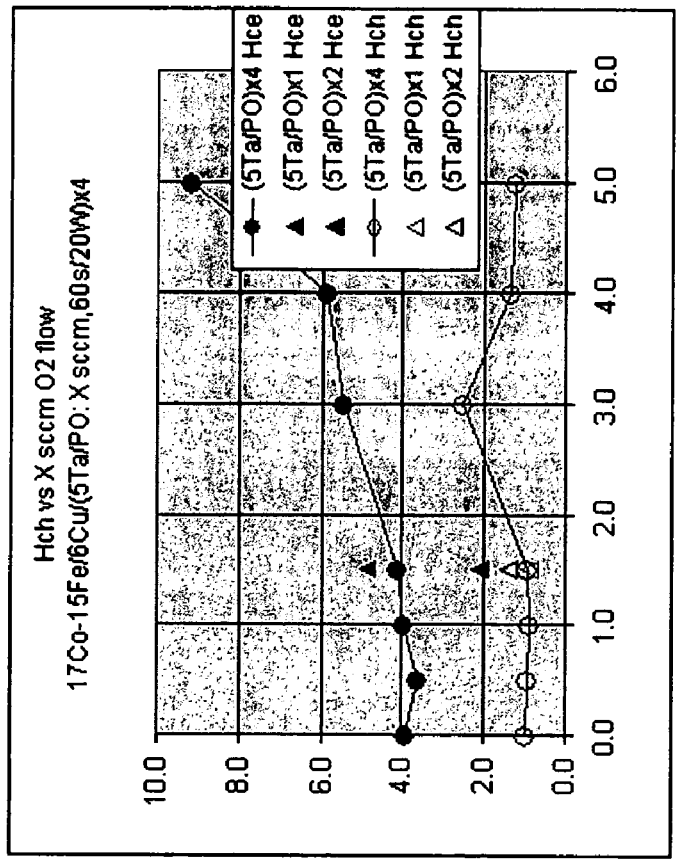
FIG. 29 is a graph showing illustrative data for coercivity $H_c$ (easy and hard) versus oxygen flow pressure when tantalum (1 nm thickness) is utilized in the insulator.
Figure 28:
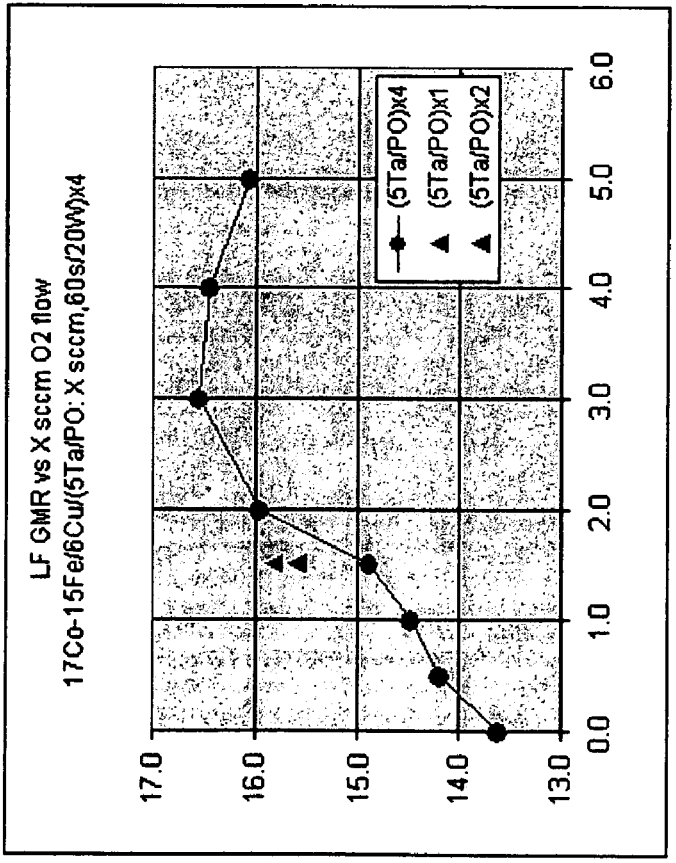
FIG. 28 is a graph showing illustrative data for low field (LF) giant magnetoresistance (GMR) versus oxygen flow pressure when tantalum (1 nm thickness) is utilized in the insulator.
Figure 30:
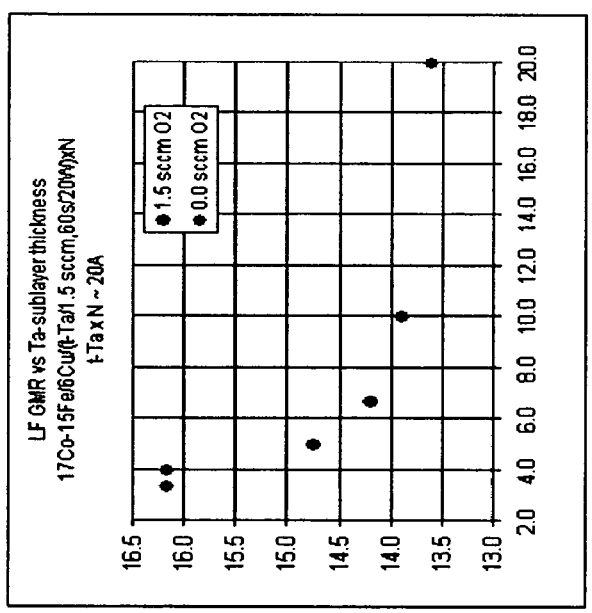
FIG. 30 is a graph showing illustrative data for LF GMR versus tantalum sublayer thickness.
Figure 31:
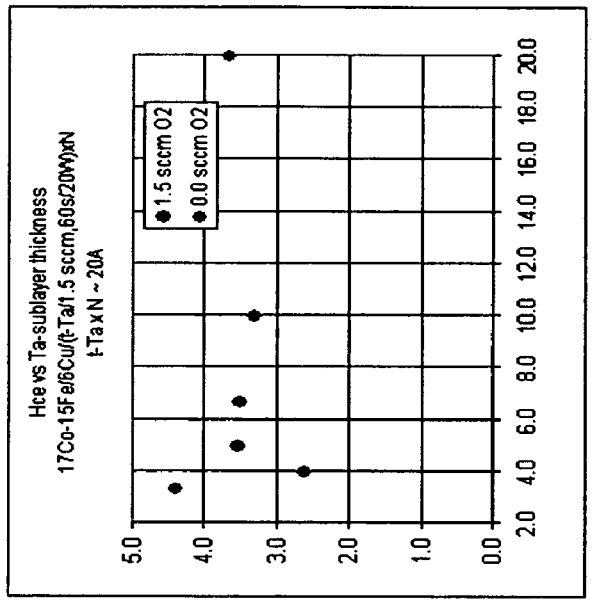
FIG. 31 is a graph showing illustrative data for coercivity $H_{ce}$ (easy) versus tantalum sublayer thickness.
Figure 32:
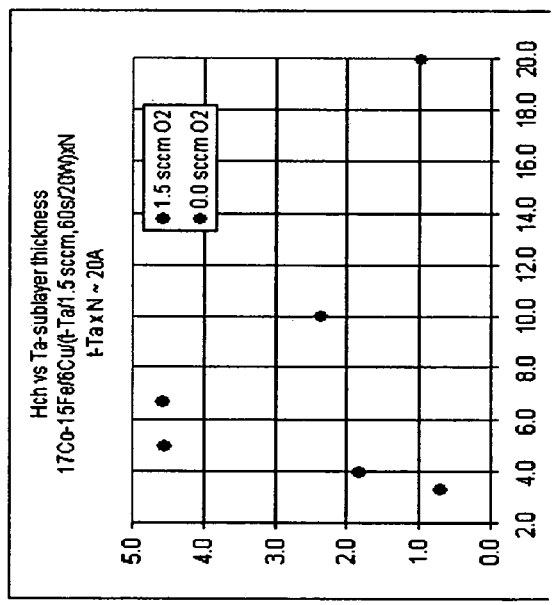
FIG. 32 is a graph showing illustrative data for coercivity $H_{ch}$ (hard) versus tantalum sublayer thickness.

Illustrative Graphical Data of FIGS. 28-32 Pertaining to the Oxidized Metal Sublayer Structure. FIGS. 28-32 are various graphs showing illustrative data for the insulator (e.g. the oxidized metal sublayer structure) utilized in the current-constraining structures. In particular, FIG. 28 is a graph showing illustrative data for low field (LF) giant magnetoresistance (GMR) versus oxygen flow rate when one, two, and four sublayers of Ta (0.5 nm thickness) are utilized. In FIG. 29, a graph showing illustrative data for coercivity Hc (easy and hard) versus oxygen flow rate for the same structure is shown. In general, FIGS. 28-29 reveal that good magnetics may be achieved and optimized in the selection of a suitable oxygen flow rate. FIG. 30 is a graph showing illustrative data for LF GMR versus Ta sublayer thickness. FIG. 31 is a graph showing illustrative data for coercivity $H_{ce}$ (easy) versus Ta sublayer thickness, and FIG. 32 is a graph showing illustrative data for coercivity $H_{ch}$ (hard) versus Ta sublayer thickness. In the data taken for graphs in FIGS. 30-32, the number of repeats were varied (N=2, 3, 4, and 5) so that (Ta×N) was about 20 Å. All data were taken using 1.5 sccm (standard centimeter cube per minute) $O_2$ flow, except at the Ta=20 Å mark (N=1) which was not oxidized. For 3.3-4 Å Ta sublayer thickness, 1.5 sccm $O_2$ flow was close to optimal, and showed LF GMR=16.2%, $H_{ce}$=4.4.5 Oe, and $H_{ch}$=1-2 Oe.

Thus; current-perpendicular-to-plane (CPP) read sensors having constrained current paths made of lithographically-defined conductive vias with surrounding oxidized metal sublayers, and methods of making the same, have been described. In one illustrative example, at least part of a sensor stack structure which includes an electrically conductive spacer layer is formed. A metal sublayer is deposited over and adjacent the spacer layer, followed by one of an oxidation process, a nitridation process, and an oxynitridation process, to produce an insulator (e.g. an oxidized metal) from the metal sublayer. The metal sublayer deposition and oxidation/nitridation/oxynitridation processes are repeated as necessary to form the insulator with a suitable thickness. Next, a resist structure which exposes one or more portions of the insulator is formed over the insulator. With the resist structure in place, exposed insulator materials are removed by etching to form one or more apertures through the insulator down to the spacer layer. Electrically conductive materials are subsequently deposited within the one or more apertures to form one or more lithographically-defined conductive vias of a current-constraining structure. Advantageously, the lithographically-defined conductive vias increase the current density of the read sensor in the region of the sensing layers to thereby simultaneously increase its resistance and magnetoresistance. With use of the process of oxidation, nitridation, or oxynitridation on each metal sublayer, degradation of the spacer layer is reduced or eliminated such that the desirable soft magnetics of the free layer in the read sensor are maintained. The size and number of vias may be varied and selected so as to precisely "tune" the sensor's resistance and magnetoresistance. As there is increasing evidence that the magnetoresistive effect is reduced near edges of the read sensor from milling damage, it is also advantageous to isolate a single or few vias in the center of the sensor structure to avoid such damage.

It is to be understood that the above is merely a description of preferred embodiments of the invention and that various changes, alterations, and variations may be made without departing from the true spirit and scope of the invention as set for in the appended claims. Few if any of the terms or phrases in the specification and claims have been given any special meaning different from their plain language meaning, and therefore the specification is not to be used to define terms in an unduly narrow sense.

What is claimed is:

1. A method of making a current-perpendicular-to-plane (CPP) read sensor having a constrained current path, comprising:

forming at least part of a sensor stack structure of the read sensor;

depositing a metal sublayer over and adjacent an electrically conductive layer of the sensor stack structure, the electrically conductive layer forming at least part of a spacer layer of the sensor stack structure;

performing, on the metal sublayer, one of an oxidation process, a nitridation process, and an oxynitridation process, to produce an insulator from the metal sublayer;

repeating the steps of depositing and performing;

forming a resist structure over the insulator which exposes materials of the insulator;

etching, with the resist structure in place, to remove the exposed materials of the insulator to thereby form one or more apertures through the insulator down to the electrically conductive layer; and forming electrically conductive materials within the one or more apertures to form one or more lithographically-defined conductive vias of a current-constraining structure of the read sensor.

2. The method of claim 1, wherein the step of performing comprises performing the oxidation process on the metal sublayer, and wherein the insulator comprises a plurality of oxidized metal sublayers.

3. The method of claim 1, wherein the metal sublayer comprises tantalum (Ta).

4. The method of claim 1, wherein the step of depositing the metal sublayer comprises depositing a metal sublayer comprising tantalum (Ta), and wherein the step of performing comprises performing the oxidation process to thereby produce an insulator comprising a plurality of oxidized tantalum (TaOx) sublayers.

5. The method of claim 1, wherein the one or more apertures comprise a single aperture through a center of the read sensor.

6. The method of claim 1, further comprising:
repeating the steps of depositing and performing at least two times.

7. The method of claim 1, further comprising:
repeating the step of depositing and performing at least three times.

8. A current-perpendicular-to-plane (CPP) read sensor having a constrained current path, the CPP read sensor comprising:
a sensor stack structure;
a current-constraining structure of the sensor stack structure formed adjacent an electrically conductive layer of the sensor stack structure;
the current-constraining structure comprising a lithographically-defined conductive via surrounded by an insulator; and
the insulator of the current-constraining structure comprising a plurality of oxidized metal sublayers.

9. The read sensor of claim 8, wherein each oxidized metal sublayer comprises a tantalum oxide (TaOx) sublayer.

10. The read sensor of claim 8, further comprising:
the electrically conductive layer comprising at least part of a spacer layer of the read sensor.

11. The read sensor of claim 8, further comprising:
a free layer; and
the electrically conductive layer comprising at least part of a spacer layer which is adjacent the free layer.

12. The read sensor of claim 8, further comprising:
the lithographically-defined conductive via comprising a single conductive via in a center of the read sensor.

13. The read sensor of claim 8, wherein the plurality of oxidized metal sublayers comprise at least four oxidized metal sublayers.

14. The read sensor of claim 8, wherein each oxidized metal sublayer alternatively comprises one of a nitrided metal sublayer and an oxynitrided metal sublayer.

15. A disk drive comprising:
a housing;
a magnetic disk rotatably supported in the housing;
a magnetic head;
a support mounted in the housing for supporting the magnetic head so as to be in a transducing relationship with the magnetic disk;
a spindle motor for rotating the magnetic disk;
an actuator positioning means connected to the support for moving the magnetic head to multiple positions with respect to said magnetic disk;
a processor connected to the magnetic head assembly, to the spindle motor, and to the actuator for exchanging signals with the magnetic head for controlling movement of the magnetic disk and for controlling the position of the magnetic head;
the magnetic head assembly including a read head having a CPP read sensor;
the CPP read sensor including:
a sensor stack structure;
a current-constraining structure of the sensor stack structure formed adjacent an electrically conductive layer of the sensor stack structure;
the current-constraining structure comprising a lithographically-defined conductive via surrounded by insulator layers; and
each insulator layer of the current-constraining structure comprising a plurality of oxidized metal sublayers.

16. The disk drive of claim 15, wherein each oxidized metal sublayer of the CPP read sensor comprises a tantalum oxide (TaOx) sublayer.

17. The disk drive of claim 15, further comprising:
the electrically conductive layer of the CPP read sensor comprising at least part of a spacer layer of the read sensor.

18. The disk drive of claim 15, wherein the CPP read sensor further comprises:
a free layer; and
the electrically conductive layer comprising at least part of a spacer layer which is adjacent the free layer.

19. The disk drive of claim 15, further comprising:
the lithographically-defined conductive via of the CPP read sensor comprising a single conductive via in a center of the read sensor.

20. The disk drive of claim 15, wherein the plurality of oxidized metal sublayers comprise at least four sublayers.

* * * * *